(12) United States Patent
Yamaguchi

(10) Patent No.: US 11,498,425 B2
(45) Date of Patent: Nov. 15, 2022

(54) GROUND FAULT DETECTION DEVICE

(71) Applicant: HONDA MOTOR CO., LTD., Tokyo (JP)

(72) Inventor: Hiroyuki Yamaguchi, Saitama (JP)

(73) Assignee: HONDA MOTOR CO., LTD., Tokyo (JP)

(*) Notice: Subject to any disclaimer, the term of this patent is extended or adjusted under 35 U.S.C. 154(b) by 0 days.

(21) Appl. No.: 17/198,786

(22) Filed: Mar. 11, 2021

(65) Prior Publication Data

US 2021/0284029 A1    Sep. 16, 2021

(30) Foreign Application Priority Data

Mar. 11, 2020   (JP) .............................. JP2020-042150

(51) Int. Cl.
| | | |
|---|---|---|
| *G01R 31/00* | (2006.01) | |
| *B60L 3/00* | (2019.01) | |
| *G01R 27/02* | (2006.01) | |
| *G01R 31/64* | (2020.01) | |
| *G01R 31/52* | (2020.01) | |

(52) U.S. Cl.
CPC .......... *B60L 3/0069* (2013.01); *G01R 27/025* (2013.01); *G01R 31/52* (2020.01); *G01R 31/64* (2020.01)

(58) Field of Classification Search
USPC .................................................. 324/503, 509
See application file for complete search history.

(56) References Cited

U.S. PATENT DOCUMENTS

2019/0100104 A1    4/2019   Kawamura
2021/0072324 A1*   3/2021   Kawamura .......... G01R 27/025

FOREIGN PATENT DOCUMENTS

JP         2019-066402 A      4/2019

* cited by examiner

*Primary Examiner* — Vincent Q Nguyen
(74) *Attorney, Agent, or Firm* — Paratus Law Group, PLLC

(57) ABSTRACT

A ground fault detection device connected to a high-voltage battery and a positive electrode side Y capacitor includes: a detection capacitor operating as a flying capacitor, a first switch and a first resistor connecting a positive electrode side of the high-voltage battery and one end of the detection capacitor in series, and a discharge circuit including at least a discharge capacitor. The discharging circuit has one end connected to the positive electrode side of the high-voltage battery and an another end connected to the negative electrode side of the high-voltage battery. The discharge circuit further includes: a fifth switch that connects one end of the discharge capacitor and the positive electrode side Y capacitor, and a second discharge resistor and an eighth switch that connect the another end of the discharge capacitor and the ground in series.

9 Claims, 15 Drawing Sheets

CHARGING VOLTAGE
OF POSITIVE ELECTRODE
SIDE Y CAPACITOR

CHARGING VOLTAGE
OF DISCHARGE
CAPACITOR

CHARGING VOLTAGE
OF DETECTION
CAPACITOR

CHARGING VOLTAGE
OF POSITIVE ELECTRODE
SIDE Y CAPACITOR

CHARGING VOLTAGE
OF DISCHARGE
CAPACITOR

CHARGING VOLTAGE
OF DETECTION
CAPACITOR

CHARGING VOLTAGE
OF POSITIVE ELECTRODE
SIDE Y CAPACITOR

CHARGING VOLTAGE
OF DISCHARGE
CAPACITOR

CHARGING VOLTAGE
OF DETECTION
CAPACITOR

CHARGING VOLTAGE
OF NEGATIVE ELECTRODE
SIDE Y CAPACITOR

CHARGING VOLTAGE
OF DISCHARGE
CAPACITOR

CHARGING VOLTAGE
OF DETECTION
CAPACITOR

CHARGING VOLTAGE
OF NEGATIVE ELECTRODE
SIDE Y CAPACITOR

CHARGING VOLTAGE
OF DISCHARGE
CAPACITOR

CHARGING VOLTAGE
OF DETECTION
CAPACITOR

GROUND FAULT DETECTION DEVICE

CROSS REFERENCE TO RELATED APPLICATIONS

This application claims priority to Japanese Patent Application No. 2020-042150 filed on Mar. 11, 2020, the content of which is incorporated herein by reference.

TECHNICAL FIELD

The present invention relates to a ground fault detection device using a flying capacitor.

BACKGROUND ART

A vehicle such as an electric automatic vehicle or a hybrid electric vehicle that is provided with a motor as a drive source and that runs by the power of the motor is provided with a battery that supplies electric power to the motor. Such a battery related power supply circuit for driving is generally configured as a high voltage circuit that handles a high voltage of 50 [V] or more. In order to secure safety, a high-voltage circuit including such a battery has a non-grounded configuration electrically insulated from a vehicle body serving as a ground reference potential point. A vehicle equipped with a non-grounded high-voltage battery is provided with a ground fault detection device that monitors an insulation state of a system (specifically, an insulation state between a main power supply system from the high-voltage battery to the motor and the vehicle body) provided with the high-voltage battery.

JP 2019-066402 A describes a ground fault detection device connected to a high-voltage battery using a capacitor called a flying capacitor. JP 2019-066402 A describes that a capacitor, which is called a Y capacitor (line bypass capacitor), is connected in parallel with a high-voltage battery.

When the high-voltage battery and the Y capacitor connected in parallel are connected to a ground fault detection device using a flying capacitor, the electric charges accumulated in the Y capacitor may flow into the flying capacitor when the insulation resistance is measured in order to detect a ground fault. From the viewpoint of enhancing the detection accuracy of the ground fault, it is desirable to reduce the amount of the electric charges flowing from the Y capacitor into the flying capacitor as much as possible, and there is room for improvement in this point.

An aspect of the present invention provides a ground fault detection device capable of reducing the electric charges flowing from a Y capacitor into a flying capacitor.

SUMMARY OF INVENTION

A ground fault detection device according to an aspect of the present invention is connected to a high-voltage battery and configured to detect a decrease in insulation resistance of a system provided with the high-voltage battery. The ground fault detection device includes: a detection capacitor operating as a flying capacitor, a control unit measuring a voltage of the detection capacitor, a first switch and a first resistor connecting a positive electrode side of the high-voltage battery and one end of the detection capacitor in series, a second switch and a second resistor connecting the negative electrode side of the high-voltage battery and an another end of the detection capacitor in series, a third switch connecting the one end of the detection capacitor and a ground, a fourth switch connecting the another end of the detection capacitor and the ground, and a discharge circuit including at least a discharge capacitor and having one end and an another end, the one end of the discharge circuit being connected to the positive electrode side of the high-voltage battery and the another end of the discharge circuit being connected to the negative electrode side of the high-voltage battery. The ground fault detection device is connected to: a positive electrode side termination resistor connecting the positive electrode side of the high-voltage battery and the ground, a negative electrode side termination resistor connecting the negative electrode side of the high-voltage battery and the ground, a positive electrode side Y capacitor connecting the positive electrode side of the high-voltage battery and the ground in parallel with the positive electrode side termination resistor, and a negative electrode side Y capacitor connecting the negative electrode side of the high voltage battery and the ground in parallel with the negative electrode side termination resistor. The one end of the discharge circuit is connected to a point closer to the positive electrode side Y capacitor than the first resistor, and the another end of the discharge circuit is connected to a point closer to the negative electrode side Y capacitor than the second resistor. The discharge circuit includes: a fifth switch that is provided at the one end of the discharge circuit and connects one end of the discharge capacitor and the positive electrode side Y capacitor, a sixth switch that is provided at the another end of the discharge circuit and connects an another end of the discharge capacitor and the negative electrode side Y capacitor, a first discharge resistor and a seventh switch that connect the one end of the discharge capacitor and the ground in series, and a second discharge resistor and an eighth switch that connect the another end of the discharge capacitor and the ground in series.

A ground fault detection device according to another aspect of the present invention is connected to a high-voltage battery and configured to detect a decrease in insulation resistance of a system provided with the high-voltage battery. The ground fault detection device includes: a detection capacitor operating as a flying capacitor, a control unit measuring a voltage of the detection capacitor, a first switch and a first resistor connecting a positive electrode side of the high-voltage battery and one end of the detection capacitor in series, a second switch and a second resistor connecting the negative electrode side of the high-voltage battery and an another end of the detection capacitor in series, a third switch connecting the one end of the detection capacitor and a ground, a fourth switch connecting the another end of the detection capacitor and the ground, and a discharge circuit including at least a first discharge capacitor and a second discharge capacitor and having one end on a first discharge capacitor side and an another end on a second discharge capacitor side, the one end of the discharge circuit being connected to a positive electrode side of the high-voltage battery, and the another end of the discharge circuit being connected to a negative electrode side of the high-voltage battery. The ground fault detection device is connected to: a positive electrode side termination resistor connecting the positive electrode side of the high-voltage battery and the ground, a negative electrode side termination resistor connecting the negative electrode side of the high-voltage battery and the ground, a positive electrode side Y capacitor connecting the positive electrode side of the high-voltage battery and the ground in parallel with the positive electrode side terminal resistor, and a negative electrode side Y capacitor connecting the negative electrode side of the high-voltage battery and the ground in parallel with the negative electrode side termination resistor. The one end of the discharge circuit is connected to a point closer to the positive electrode side Y capacitor than the first resistor, and the another end of the discharge circuit is connected to a point closer to the negative electrode side Y capacitor than the second resistor. The discharge circuit includes: a fifth switch that is provided at the one end of the discharge circuit and connects one end of the first discharge capacitor to the positive electrode side Y capacitor, a sixth switch that is provided at the another end of the discharge circuit and connects one end of the second discharge capacitor to the negative electrode side Y capacitor, a seventh switch that connects the one end of the first discharge capacitor and the ground, an eighth switch that connects the one end of the second discharge capacitor and the ground, and a first circuit that connects an another end of the first discharge capacitor and another end of the second discharge capacitor to the ground. The first circuit includes a first discharge resistor.

DESCRIPTION OF EMBODIMENTS

Hereinafter, an embodiment of a ground fault detection device of the present invention will be described in detail with reference to the drawings.

[Vehicle]

Figure 1:
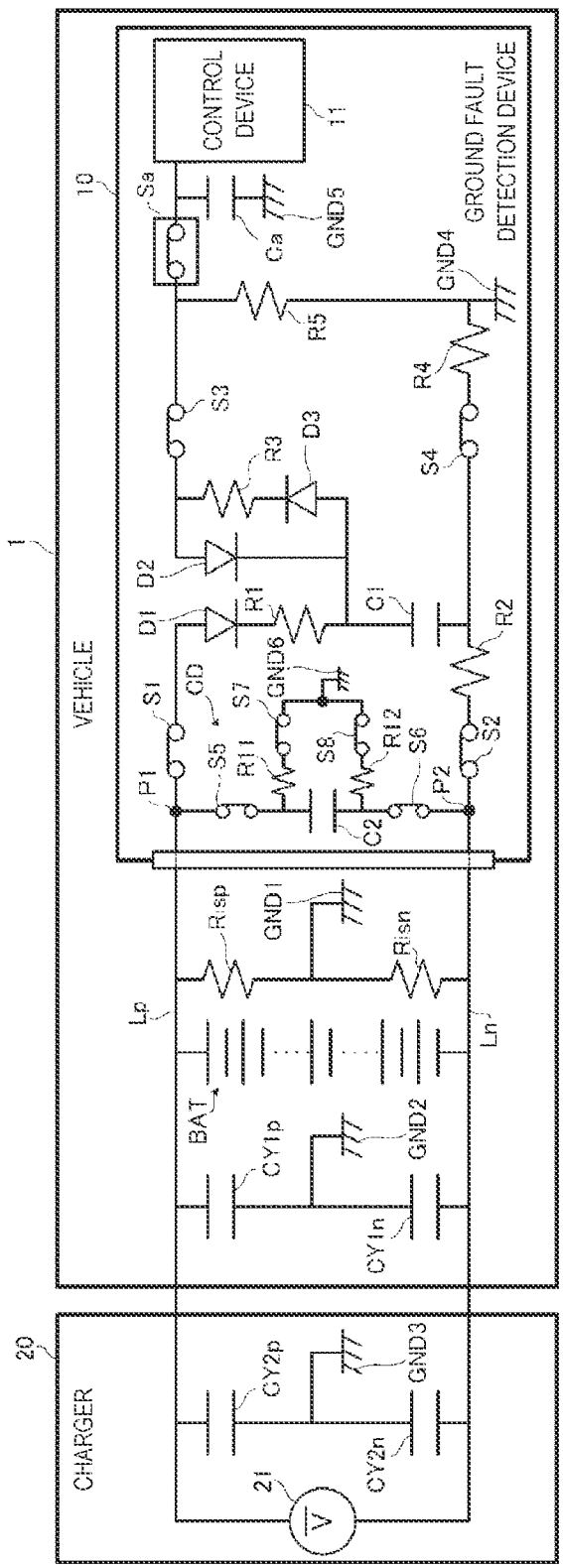
FIG. 1 is a diagram showing an example of a vehicle including a ground fault detection device according to an embodiment of the present invention.

First, a vehicle including a ground fault detection device according to the present embodiment will be described with reference to FIG. 1. In FIG. 1, a vehicle 1 is an electric vehicle or a plug-in hybrid electric vehicle. That is, the vehicle 1 includes a motor (not shown) serving as a driving source and a high-voltage battery BAT, and is configured to be able to run by a motor outputting power corresponding to the electric power supplied from the high-voltage battery BAT. The high-voltage battery BAT is, for example, a battery capable of outputting a high voltage of 50 [V] or more, and is configured by connecting a plurality of secondary batteries such as a lithium ion battery and a nickel hydrogen battery in series.

As shown in FIG. 1, the vehicle 1 may be connected to a charger 20 that outputs electric power of a power supply 21 (for example, a commercial power supply). Specifically the vehicle 1 includes a connector (not shown) that can be connected to the charger 20. The vehicle 1 is configured to be able to charge the high-voltage battery BAT by using electric power received from the charger 20 connected via the connector. The charger 20 is installed in, for example, a facility capable of performing a charging operation with respect to a vehicle 1 such as a so-called charging station.

In the vehicle 1, the positive electrode terminal of the high-voltage battery BAT is connected to a positive electrode side power supply line Lp, and the negative electrode terminal of the high-voltage battery BAT is connected to a negative electrode side power supply line Ln. In addition, the positive electrode side (that is, the positive electrode side power supply line Lp) of the high-voltage battery BAT is connected to the ground GND1 via a positive electrode side termination resistor Risp, and the negative electrode side (that is, the negative electrode side power supply line Ln) of the high-voltage battery BAT is also connected to the ground GND1 via a negative electrode side termination resistor Risn. The ground GND1 is, for example, a vehicle body.

In other words, the positive electrode side termination resistor Risp connects the positive electrode side of the high-voltage battery BAT and the ground GND1, and the negative electrode side termination resistor Risn connects the negative electrode side of the high-voltage battery BAT and the ground GND1. The positive electrode side termination resistor Risp is an insulation resistance between the positive electrode side of the high voltage battery BAT and the ground GND1, and the negative electrode side termination resistor Risn is an insulation resistance between the negative electrode side of the high-voltage battery BAT and the ground GND1. It is assumed that the electric resistance values of the positive electrode side termination resistor Risp and the negative electrode side termination resistor Risn are sufficiently larger than a predetermined insulation resistance value determined to be a ground fault by the control device 11.

In addition, the vehicle 1 is provided with a vehicle positive electrode side Y capacitor CY1p and a vehicle negative electrode side Y capacitor CY in for the purpose of eliminating high-frequency noise and stabilizing operation in a system (specifically, a main power supply system from the high-voltage battery BAT to a motor serving as a driving source of the vehicle 1) provided with the high-voltage battery BAT. The vehicle positive electrode side Y capacitor CY1p and the vehicle negative electrode side Y capacitor CY1n are so-called Y capacitors (line bypass capacitors).

The vehicle positive electrode side Y capacitor CY1p is connected in parallel to the positive electrode side termination resistor Risp, and connects the positive electrode side (that is, the positive electrode side power source line Lp) of the high-voltage battery BAT and the ground GND2. The vehicle negative electrode side Y capacitor CY1n is connected in parallel to the negative electrode side termination resistor Risn, and connects the negative electrode side of the high-voltage battery BAT (that is, the negative electrode side power supply line Ln) and the ground GND2. The ground GND2 is, for example, the vehicle body. The ground GND2 may be common to the ground GND1.

Similar to the vehicle 1, the charger 20 is also provided with a Y capacitor. Specifically, the charger 20 is provided with a charger positive electrode side Y capacitor CY2p and a charger negative electrode side Y capacitor CY2n. The charger positive electrode side Y capacitor CY2p connects the positive electrode side of the power source 21 and the ground GND3. The charger negative electrode side Y capacitor CY2n connects the negative electrode side of the power source 21 and the ground GND3. The ground GND3 is a ground provided to the charger 20.

As shown in FIG. 1, in a case where the vehicle 1 is connected to the charger 20, the charger positive electrode side Y capacitor CY2p is connected in parallel to the vehicle positive electrode side Y capacitor CY1p, and the charger negative electrode side Y capacitor CY2n is connected in parallel with the vehicle negative electrode side Y capacitor CY1n.

Hereinafter, the Y capacitor provided on the positive electrode side of the high-voltage battery BAT (that is, the positive electrode side power supply line Lp) may be referred to as a positive electrode side Y capacitor CYp. Specifically, in a case where the vehicle 1 is not connected to the charger 20, the positive electrode side Y capacitor CYp is the vehicle positive electrode side Y capacitor CY1p. On the other hand, in a case where the vehicle 1 is connected to the charger 20, the positive electrode side Y capacitor CYp is the vehicle positive electrode side Y capacitor CY1p and the charger positive electrode side Y capacitor CY2p which are connected in parallel.

In addition, hereinafter, the Y capacitor provided on the negative electrode side of the high-voltage battery BAT (that is, the negative electrode side power supply line Ln) may be referred to as a negative electrode side Y capacitor CYn. Specifically, in a case where the vehicle 1 is not connected to the charger 20, the negative electrode side Y capacitor CYn is the vehicle negative electrode side Y capacitor CY1n. On the other hand, in a case where the vehicle 1 is connected to the charger 20, the negative electrode side Y capacitor CYn is the vehicle negative electrode side Y capacitor CY1n and the charger negative electrode side Y capacitor CY2n which are connected in parallel.

[Ground Fault Detection Device]

As shown in FIG. 1, the vehicle 1 further includes a ground fault detection device 10 that detects a ground fault (an insulation state) between a system provided with a high-voltage battery BAT and a vehicle body. The ground fault detection device 10 is an example of a ground fault detection device of the present invention, and is connected to the positive electrode side termination resistor Risp, the negative electrode side termination resistor Risn, the positive electrode side Y capacitor CYp, and the negative electrode side Y capacitor CYn.

Further, the ground fault detection device 10 includes a detection capacitor C1 that operates as a flying capacitor. As the detection capacitor C1, a capacitor having an electrostatic capacitance smaller than that of each of the Y capacitors described above is used.

Specifically, in the present embodiment, the magnitude relationship of the electrostatic capacitance of each capacitor is the detection capacitor C1 < the vehicle positive electrode side Y capacitor CY1p=the vehicle negative electrode side Y capacitor CY1n< the charger positive electrode side Y capacitor CY2p=the charger negative electrode side Y capacitor CY2n. For example, the electrostatic capacitances of the vehicle positive electrode side Y capacitor CY1p and the vehicle negative electrode side Y capacitor CY1n are about several times the electrostatic capacitance of the detection capacitor C1, and the electrostatic capacitances of the charger positive electrode side Y capacitor CY2p and the charger negative electrode side Y capacitor CY2n are about several tens of times the electrostatic capacitance of the detection capacitor C1.

Further, in order to control the charging/discharging of the detection capacitor C1, the ground fault detection device 10 includes four switches of a first switch S1, a second switch S2, a third switch S3, and a fourth switch S4 around the detection capacitor C1. Further, the ground fault detection device 10 includes a measurement switch Sa for sampling a measurement voltage (that is, a charge voltage of a measurement capacitor Ca to be described later) corresponding to a charge voltage of the detection capacitor C1. The first switch S1, the second switch S2, the third switch S3, the fourth switch S4, and the measurement switch Sa are, for example, insulated switching elements such as an optical MOSFET.

Specifically, in the ground fault detection device 10, one end of the first switch S1 is connected to the positive electrode side of the high-voltage battery BAT (that is, the positive electrode side power supply line Lp). The other end of the first switch S1 is connected to the anode side of a first diode D1. The cathode side of the first diode D1 is connected to one end of a first resistor R1 having a predetermined electric resistance value. The other end of the first resistor R1 is connected to one end (for example, a positive terminal) of the detection capacitor C1 That is, the first switch S1 and the first resistor R1 connect the positive electrode side of the high-voltage battery BAT and one end of the detection capacitor C1 in series.

In addition, in the ground fault detection device 10, one end of the second switch S2 is connected to the negative electrode side of the high-voltage battery BAT (that is, the negative electrode side power supply line Ln). The other end of the second switch S2 is connected to one end of a second resistor R2 having a predetermined electric resistance value. The other end of the second resistor R2 is connected to the other end (for example, a negative electrode terminal) of the detection capacitor C1. That is, the second switch S2 and the second resistor R2 connect the negative electrode side of the high-voltage battery BAT and the other end of the detection capacitor C1 in series.

In addition, in the ground fault detection device 10, one end of the third switch S3 is connected to one end of a third resistor R3 having a predetermined electric resistance value and the anode side of a second diode D2. The other end of the third switch S3 is connected to the ground GND4 via a fifth resistor R5 having a predetermined electric resistance value. That is, the third switch S3, the third resistor R3, and the fifth resistor R5 connect one end of the detection capacitor C1 to the ground GND4. The ground GND4 is, for example, the vehicle body. The ground GND4 may be common to the ground GND1 and the ground GND2.

The other end of the third switch S3 is also connected to one end of the measurement switch Sa. The other end of the measurement switch Sa is connected to one end of the measurement capacitor Ca and an input terminal (for example, an analog input terminal) of the control device 11. The other end of the measurement capacitor Ca is connected to the ground GND5. The ground GND5 is, for example, the vehicle body. The ground GND5 may be common to the ground GND1, the ground GND2, and the ground GND4.

For example, when the measurement switch Sa is on, a signal (for example, an analog signal) indicating the charging voltage of the measurement capacitor Ca is input from the input terminal of the control device 11 connected to one end of the measurement capacitor Ca to the control device 11, and the control device 11 can acquire the charging voltage of the measurement capacitor Ca based on the signal.

The cathode side of the second diode D2 is connected to the other end of the first resistor R1, one end of the detection capacitor C1, and the anode side of a third diode D3. The cathode side of the third diode D3 is connected to the other end of the third resistor R3.

In addition, in the ground fault detection device 10, one end of the fourth switch S4 is connected to the other end of the second resistor R2 and the other end of the detection capacitor C1. The other end of the fourth switch S4 is connected to the ground GND4 via a fourth resistor R4 having a predetermined electric resistance value. That is, the fourth switch S4 and the fourth resistor R4 connect the other end of the detection capacitor C1 and the ground GND4.

The ground fault detection device 10 further includes the control device 11. The control device 11 is an example of a control unit in the present invention, and measures the voltage (charging voltage) of the detection capacitor C1, and controls on/off of each switch (for example, the first switch S1 to the fourth switch S4, the measurement switch Sa, and the fifth switch S5 to the eighth switch S8 described later) included in the ground fault detection device 10. The control device 11 is constituted by, for example, a microcomputer or the like, and executes various types of control required in the ground fault detection device 10 by executing a program incorporated in advance. An example of the control performed by the control device 11 will be described later with reference to FIG. 2 and the like.

The ground fault detection device 10 further includes a discharge circuit CD. One end of the discharge circuit CD is connected to the positive electrode side Y capacitor CYp side of the first resistor R1, and the other end of the discharge circuit CD is connected to the negative electrode side Y capacitor CYn side of the second resistor R2. As shown in FIG. 1, the discharge circuit CD is connected in parallel to the first switch S1, the first resistor R1, the detection capacitor C1, the second resistor R2, and the second switch S2 which are connected in series.

The discharge circuit CD includes a discharge capacitor C2, a fifth switch S5, a sixth switch S6, a seventh switch S7, an eighth switch S8, a first discharge resistor R11, and a second discharge resistor R12.

The discharge capacitor C2 is a capacitor having a predetermined capacitance. The fifth switch S5, the sixth switch S6, the seventh switch S7, and the eighth switch S8 are, for example, insulated switching elements such as an optical MOSFET. The first discharge resistor R11 and the second discharge resistor R12 are resistors having a predetermined electrical resistance value. An example of the electrical resistance values of the first discharge resistor R11 and the second discharge resistor R12 will be described later.

Specifically, one end of the fifth switch S5 is connected to the positive electrode side Y capacitor CYp and the positive electrode side of the high-voltage battery BAT (that is, the positive electrode side power supply line Lp) and one end of the first switch S1. More specifically, as shown in FIG. 1, a connection point P1 between one end of the fifth switch S5 and the positive electrode side power supply line Lp is provided on the positive electrode side Y capacitor CYp side of the first switch S1 and the first resistor R1 in the ground fault detection device 10. The connection point P1 corresponds to one end of the discharge circuit CD described above.

The other end of the fifth switch S5 is connected to one end of the discharge capacitor C2. That is, the fifth switch S5 connects one end of the discharge capacitor C2 and the positive electrode side Y capacitor CYp. One end of the discharge capacitor C2 is also connected to the ground GND6 via the first discharge resistor R11 and the seventh switch S7 which are connected in series. That is, the first discharge resistor R11 and the seventh switch S7 connected in series are connected to one end of the discharge capacitor C2 and the ground GND6. The ground GND6 is, for example, the vehicle body. The ground GND6 may be common to the ground GND1, the ground GND2, and the ground GND4.

One end of the sixth switch S6 is connected to the negative electrode side Y capacitor CYn and the negative electrode side of the high-voltage battery BAT (that is, the negative electrode side power supply line Ln), and one end of the second switch S2. More specifically, as shown in FIG.

1, a connection point P2 between one end of the sixth switch S6 and the negative electrode side power supply line Ln is provided on the negative electrode side Y capacitor CYn side of the second resistor R2 in the ground fault detection device 10. The connection point P2 corresponds to the other end of the discharge circuit CD described above.

The other end of the sixth switch S6 is connected to the other end of the discharge capacitor C2. That is, the sixth switch S6 connects the other end of the discharge capacitor C2 and the negative electrode side Y capacitor CYn. The other end of the discharge capacitor C2 is also connected to the ground GND6 via the second discharge resistor R12 and the eighth switch S8 which are connected in series. That is, the second discharge resistor R12 and the eighth switch S8 connected in series are connected to the other end of the discharge capacitor C2 and the ground GND6.

In the present embodiment, it is assumed that the electrical resistance value of the first discharge resistor R11 is smaller than the electrical resistance value of the second resistor R2, and the electrical resistance value of the second discharge resistor R12 is smaller than the electrical resistance value of the first resistor R1.

For example, from the viewpoint of securing the time until the charging of the detection capacitor C1 is completed, a resistor having a large electric resistance value of, for example, about several hundred [kΩ] is used as the first resistor R1 and the second resistor R2. When the electric charges of the positive electrode side Y capacitor CYp and the negative electrode side Y capacitor CYn are discharged via the first resistor R1 and the second resistor R2, it may take a long time to complete the discharge.

Therefore, in the ground fault detection device 10, by making the electrical resistance value of the second discharge resistor R12 smaller than the electrical resistance value of the first resistor R1, the time required to discharge the electric charges of the positive electrode side Y capacitor CYp is shortened when the positive electrode side Y capacitor discharge state is set which will be described later. Similarly, by making the electric resistance value of the first discharge resistor R11 smaller than the electric resistance value of the second resistor R2, the time required to discharge the electric charges of the negative electrode side Y capacitor CYn can be shortened when the negative electrode side Y capacitor discharge state is set which will be described later. As a result, it is possible to accelerate the timing of transition to the positive electrode side voltage measurement state or the negative electrode side voltage measurement state which will be described later, and it is possible to shorten the time required to detect the ground fault.

[Ground Fault Detection by Ground Fault Detection Device]

Next, an example of a method of detecting a ground fault by the ground fault detection device 10 will be described with reference to FIGS. 2 to 12. For example, when the vehicle 1 is activated and when the vehicle 1 is charged by the charger 20, the control device 11 of the ground fault detection device 10 performs the ground fault detection process shown in FIG. 2 at a predetermined cycle.

Figure 2:
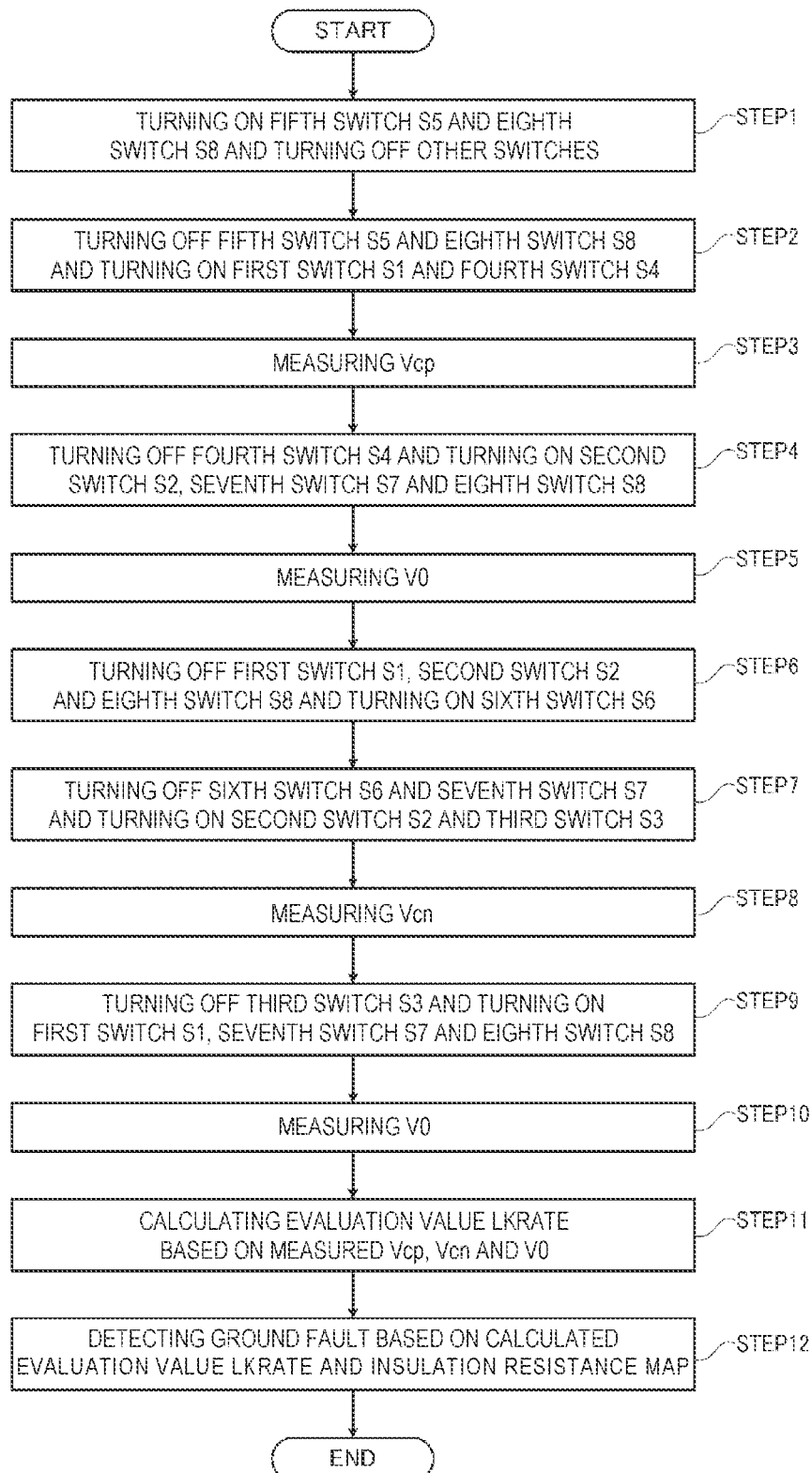
FIG. 2 is a flowchart showing an example of a ground fault detection process performed by a control device included in the ground fault detection device according to the present embodiment.

As shown in FIG. 2, first, the control device 11 turns on the fifth switch S5 and the eighth switch S8, and turns off the other switches (STEP 1). As a result of the process of STEP1, the ground fault detection device 10 is in a state in which the fifth switch S5 and the eighth switch S8 are on and the first switch S1, the second switch S2, the third switch S3, the fourth switch S4, the sixth switch S6, and the seventh switch S7 are off (hereinafter also referred to as a positive electrode side Y capacitor discharge state).

Figure 3:
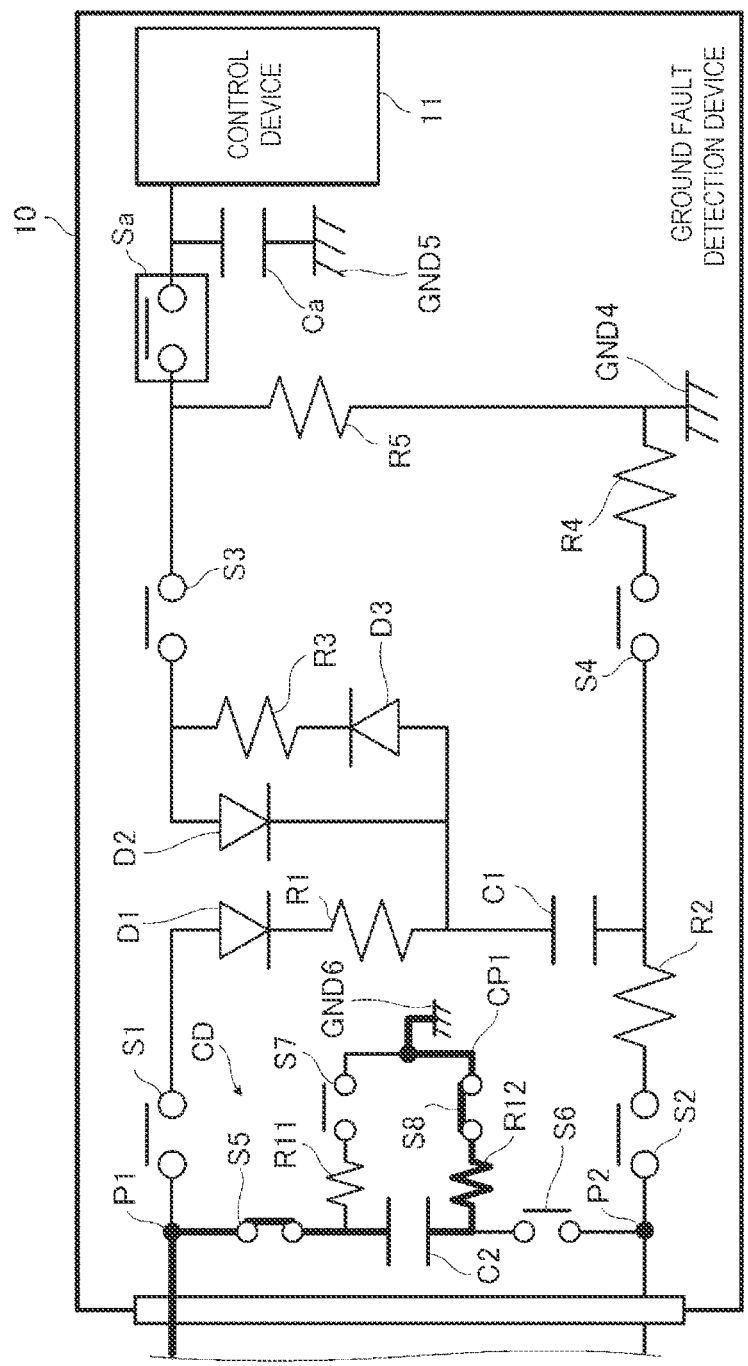
FIG. 3 is a diagram showing an example of a path of a current flowing through the ground fault detection device in a positive electrode side Y capacitor discharge state.

FIG. 3 shows a path (current path) of the current flowing through the ground fault detection device 10 in the positive electrode side Y capacitor discharge state. In FIG. 3, the same portions as those in FIG. 1 are omitted as appropriate.

As shown in the current path CP1 of FIG. 3, when the ground fault detection device 10 is in the positive electrode side Y capacitor discharge state, the electric charges accumulated in the positive electrode side Y capacitor CYp are discharged to the discharge capacitor C2 via the fifth switch S5. The control device 11 maintains the positive electrode side Y capacitor discharge state of the ground fault detection device 10 for a predetermined period (for example, several hundred [ms]).

FIG. 4 shows an example of a change of the charging voltage of each of the positive electrode side Y capacitor CYp, the discharge capacitor C2, and the detection capacitor C1 over time when the ground fault detection device 10 is in the positive electrode side Y capacitor discharge state. In FIG. 4, each vertical axis represents voltage, and each horizontal axis represents time.

Figure 4A:
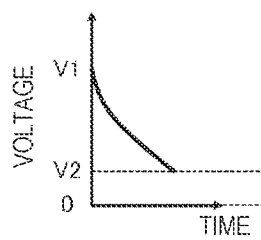
FIG. 4A is a diagram showing an example of a change with time of a charging voltage of a positive electrode side Y capacitor.

As described above, when the ground fault detection device 10 is in the positive electrode side Y capacitor discharge state, the electric charges of the positive electrode side Y capacitor CYp are discharged to the discharge capacitor C2. Therefore, when the ground fault detection device 10 is in the positive electrode side Y capacitor discharge state, the charging voltage of the positive electrode side Y capacitor CYp decreases with time as shown in FIG. 4A. In the example shown in FIG. 4A, the charging voltage of the positive electrode side Y capacitor CYp decreases from V1 to V2.

Figure 4B:
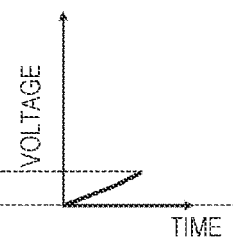
FIG. 4B is a diagram showing an example of a change with time of a charging voltage of a discharge capacitor.

On the other hand, when the ground fault detection device 10 is in the positive electrode side Y capacitor discharge state, the discharge capacitor C2 is charged by the electric charges discharged from the positive electrode side Y capacitor CYp. Therefore, the charging voltage of the discharging capacitor C2 rises with time as shown in FIG. 4B. In the example shown in FIG. 4B, the charging voltage of the discharging capacitor C2 rises from 0 to V2.

Figure 4C:
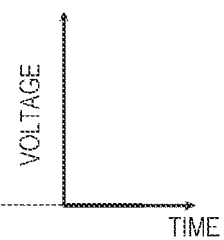
FIG. 4C is a diagram showing an example of a change with time of a charging voltage of a detection capacitor in a ground fault detection device in a positive electrode side Y capacitor discharge state.

When the ground fault detection device 10 is in the positive electrode side Y capacitor discharge state, no current flows through the circuit including the detection capacitor C1. Therefore, the charging voltage of the detection capacitor C1 does not change as shown in FIG. 4C. In the example shown in FIG. 4C, the charging voltage of the detection capacitor C1 remains 0.

Next, the control device 11 turns off the fifth switch S5 and the eighth switch S8 from the positive electrode side Y capacitor discharge state, and turns on the first switch S1 and the fourth switch S4 (STEP 2). As a result of the process of STEP 2, the ground fault detection device 10 is in a state in which the first switch S1 and the fourth switch S4 are on and the second switch S2, the third switch S3, the fifth switch S5, the sixth switch S6, the seventh switch S7, and the eighth switch S8 are off (hereinafter, also referred to as a positive electrode side voltage measurement state).

Figure 5:
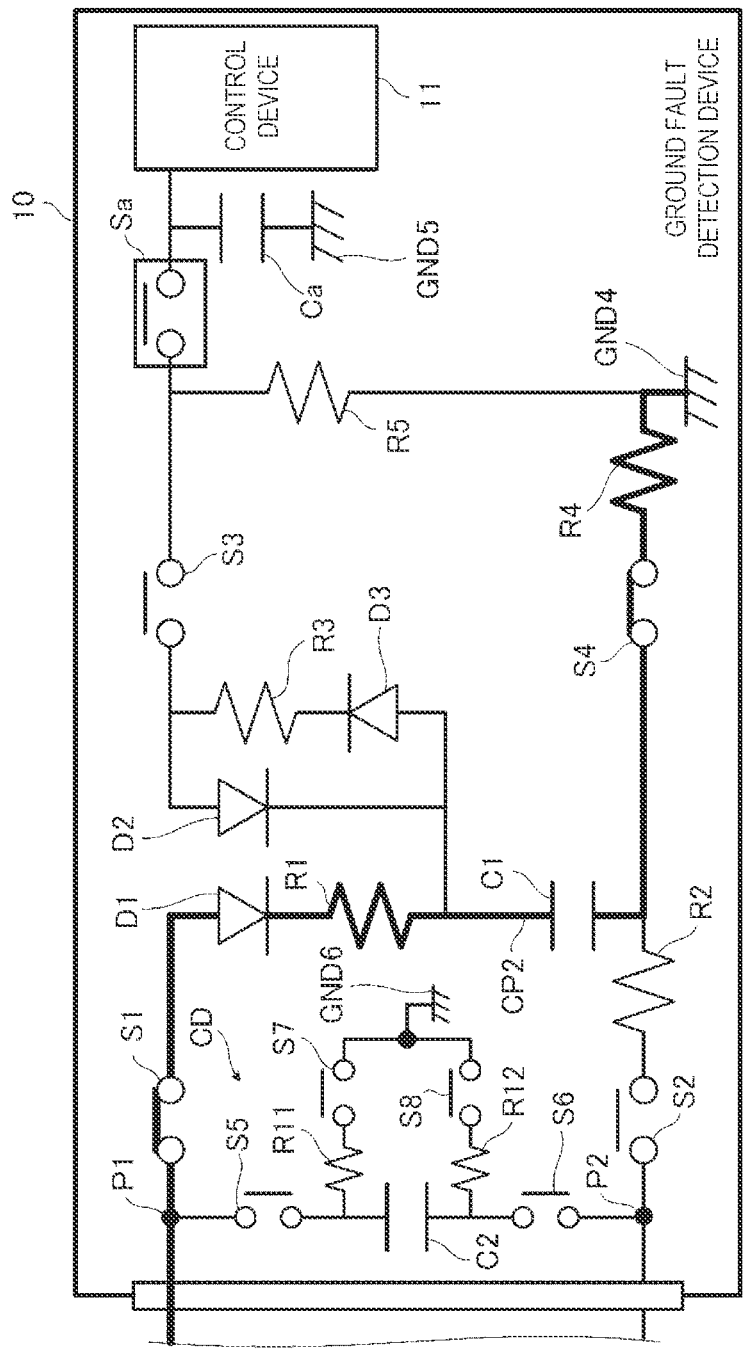
FIG. 5 is a diagram showing an example of a path of a current flowing through the ground fault detection device in a positive electrode side voltage measurement state.

FIG. 5 shows a path (current path) of the current flowing through the ground fault detection device 10 in the positive electrode side voltage measurement state. In FIG. 5, the same portions as those in FIG. 1 are omitted as appropriate.

As shown in the current path CP2 of FIG. 5, when the ground fault detection device 10 is in the positive electrode side voltage measurement state, the detection capacitor C1 is charged according to the voltage between the positive electrode side of the high-voltage battery BAT and the ground GND4. Although not shown in FIG. 5, when the ground fault detection device 10 is in the positive electrode side voltage measurement state, the positive electrode side Y capacitor CYp is also charged in the same manner as the detection capacitor C1. The control device 11 maintains the positive electrode side voltage measurement state of the ground fault detection device 10 for a predetermined period (for example, several hundred [ms]).

FIG. 6 shows an example of a change with time of the charging voltage of each of the positive electrode side Y capacitor CYp, the discharge capacitor C2, and the detection capacitor C1 when the ground fault detection device 10 is in the positive electrode side voltage measurement state. In FIG. 6, each vertical axis represents voltage, and each horizontal axis represents time.

Figure 6A:
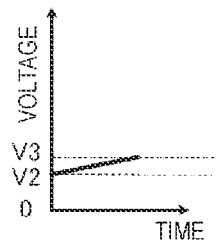
FIG. 6A is a diagram showing an example of a change with time of a charging voltage of the positive electrode side Y capacitor.
Figure 6B:
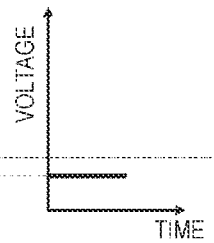
FIG. 6B is a diagram showing an example of a change with time of a charging voltage of the discharge capacitor.
Figure 6C:
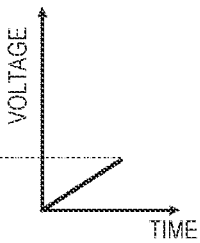
FIG. 6C is a diagram showing an example of a change with time of a charging voltage of the detection capacitor in the ground fault detection device in a positive electrode side voltage measurement state.

As described above, when the ground fault detection device 10 is in the positive electrode side voltage measurement state, the positive electrode side Y capacitor CYp and the detection capacitor C1 are charged according to the voltage between the positive electrode side of the high-voltage battery BAT and the ground GND4. Therefore, when the ground fault detection device 10 is in the positive electrode side voltage measurement state, the charging voltage of the positive electrode side Y capacitor CYp rises with time as shown in FIG. 6A. In the example shown in FIG. 6A, the charging voltage of the positive electrode side Y capacitor CYp rises from V2 to V3. Similarly, the charging voltage of the detection capacitor C1 also rises with time as shown in FIG. 6C. In the example shown in FIG. 6C, the charging voltage of the detection capacitor C1 rises from 0 to V3.

When the ground fault detection device 10 is in the positive electrode side voltage measurement state, no current flows through the discharge circuit CD including the discharge capacitor C2. Therefore, the charging voltage of the discharge capacitor C2 does not change as shown in FIG. 6B. In the example shown in FIG. 6B, the charging voltage of the discharging capacitor C2 remains at V2.

When a predetermined period elapses after the ground fault detection device 10 is in the positive electrode side voltage measurement state, the charging voltage of the detection capacitor C1 becomes equal to the charging voltage of the positive electrode side Y capacitor CYp (for example, refer to V3 in FIG. 6A and FIG. 6C). The charging voltage of the detection capacitor C1 at this time is hereinafter referred to as Vcp. The control device 11 measures the charging voltage of the detection capacitor C1 as Vcp when a predetermined period of time has elapsed since the ground fault detection device 10 is in the positive electrode side voltage measurement state (STEP 3).

In measuring the charging voltage of the detection capacitor C1, the control device 11 turns off the first switch S1 and the second switch S2, turns on the third switch S3 and the fourth switch S4, and turns on the measurement switch Sa. As a result, the measurement capacitor Ca is charged until the charging voltage of the measurement capacitor Ca becomes equal to the charging voltage of the detection capacitor C1 at that time. Then, the control device 11 obtains the charging voltage of the charged measurement capacitor Ca as a measurement voltage corresponding to the charging voltage of the detection capacitor C1. Thus, the control device 11 can indirectly measure the charging voltage of the detection capacitor C1.

Next, the control device 11 turns off the fourth switch S4 from the positive electrode side voltage measurement state, and turns on the second switch S2, the seventh switch S7, and the eighth switch S8 (STEP 4). As a result of the process of STEP 4, the ground fault detection device 10 is in a state in which the first switch S1, the second switch S2, the seventh switch S7, and the eighth switch S8 are on and the third switch S3, the fourth switch S4, the fifth switch S5, and the sixth switch S6 are off (hereinafter, also referred to as an overall voltage measurement state).

Figure 7:
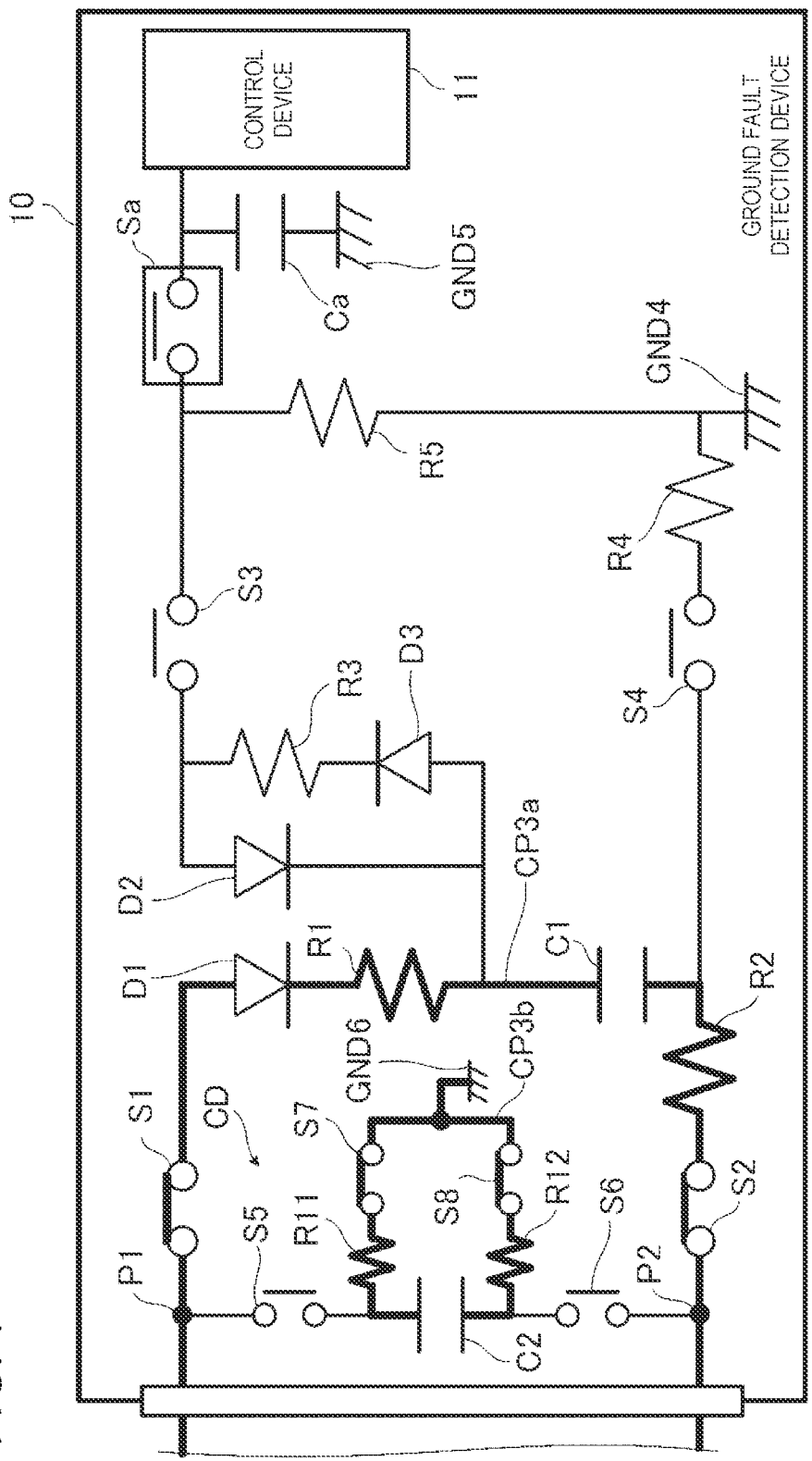
FIG. 7 is a diagram showing an example of a path of a current flowing through the ground fault detection device in an overall voltage measurement state.

FIG. 7 shows a path (current path) of the current flowing through the ground fault detection device 10 in the overall voltage measurement state. In FIG. 7, the same portions as those in FIG. 1 are omitted as appropriate.

As shown in the current path CP3a of FIG. 7, when the ground fault detection device 10 is in the overall voltage measurement state, the detection capacitor C1 is charged according to the voltage between the positive electrode side and the negative electrode side of the high-voltage battery BAT. Although not shown in FIG. 7, when the ground fault detection device 10 is in the overall voltage measurement state, the positive electrode side Y capacitor CYp is also charged in the same manner as the detection capacitor C1.

Further, as shown in the current path CP3b in FIG. 7, when the ground fault detection device 10 is in the overall voltage measurement state, the electric charges accumulated in the discharge capacitor C2 are discharged to the ground GND6. The control device 11 maintains the overall voltage measurement state of the ground fault detection device 10 for a predetermined period (for example, several hundred [ms]).

FIG. 8 shows an example of a change with time of the charging voltage of each of the positive electrode side Y capacitor CYp, the discharge capacitor C2, and the detection capacitor C1 when the ground fault detection device 10 is in the overall voltage measurement state. In FIG. 8, each vertical axis represents voltage, and each horizontal axis represents time.

Figure 8A:
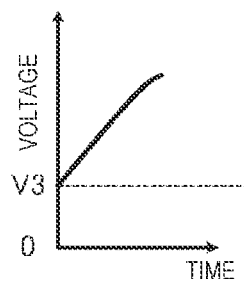
FIG. 8A is a diagram showing an example of a change with time of the charging voltage of a positive electrode side Y capacitor.
Figure 8B:
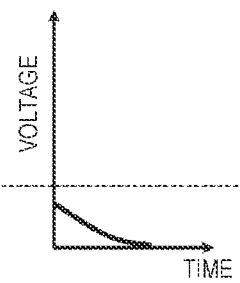
FIG. 8B is a diagram showing an example of a change with time of the charging voltage of a discharge capacitor.
Figure 8C:
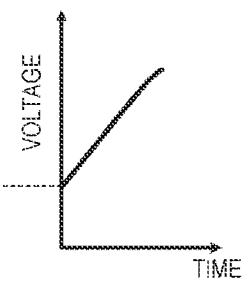
FIG. 8C is a diagram showing an example of a change with time of the charging voltage of a detection capacitor in the ground fault detection device in the overall voltage measurement state.

As described above, when the ground fault detection device 10 is in the overall voltage measurement state, the positive electrode side Y capacitor CYp and the detection capacitor C1 are charged according to the voltage between the positive electrode side and the negative electrode side of the high-voltage battery BAT. Therefore, when the ground fault detection device 10 is in the overall voltage measurement state, the charge voltage of the positive electrode side Y capacitor CYp rises with time as shown in FIG. 8A. In the example shown in FIG. 8A, the charging voltage of the positive electrode side Y capacitor CYp rises to a voltage higher than V3. Similarly, the charging voltage of the detection capacitor C1 also rises with time as shown in FIG. 8C. In the example shown in FIG. 8C, the charging voltage of the detection capacitor C1 also rises to a voltage higher than V3.

On the other hand, when the ground fault detection device 10 is in the overall voltage measurement state, the electric charges of the discharge capacitor C2 are discharged to the ground GND6. Therefore, the charging voltage of the discharging capacitor C2 decreases with time as shown in FIG. 8B. In the example shown in FIG. 8B, the charging voltage of the discharging capacitor C2 decreases to approximately zero.

When a predetermined period elapses after the ground fault detection device 10 is in the overall voltage measurement state, the charging voltage of the detection capacitor C1 becomes equal to the voltage between the positive electrode side and the negative electrode side of the high-voltage battery BAT. The charging voltage of the detection capacitor C1 at this time is hereinafter referred to as V0. The control device 11 measures the charging voltage of the detection capacitor C1 as V0 when a predetermined period has elapsed since the ground fault detection device 10 is in the overall voltage measurement state (STEP 5).

For example, when the measurement of V0 is completed, the control device 11 turns off the first switch S1 and the second switch S2, turns on the third switch S3 and the fourth switch S4, and discharges the detection capacitor C1. That is, when the measurement of V0 is completed, the control device 11 sets the charging voltage of the detection capacitor C1 to 0.

Next, the control device 11 turns off the first switch S1, the second switch S2, and the eighth switch S8 from the overall voltage measurement state, and turns on the sixth switch S6 (STEP 6). As a result of the process of STEP 6, the ground fault detection device 10 is in a state in which the sixth switch S6 and the seventh switch S7 are on and the first switch S1, the second switch S2, the third switch S3, the fourth switch S4, the fifth switch S5, and the eighth switch S8 are off (hereinafter, also referred to as a negative electrode side Y capacitor discharge state).

Figure 9:
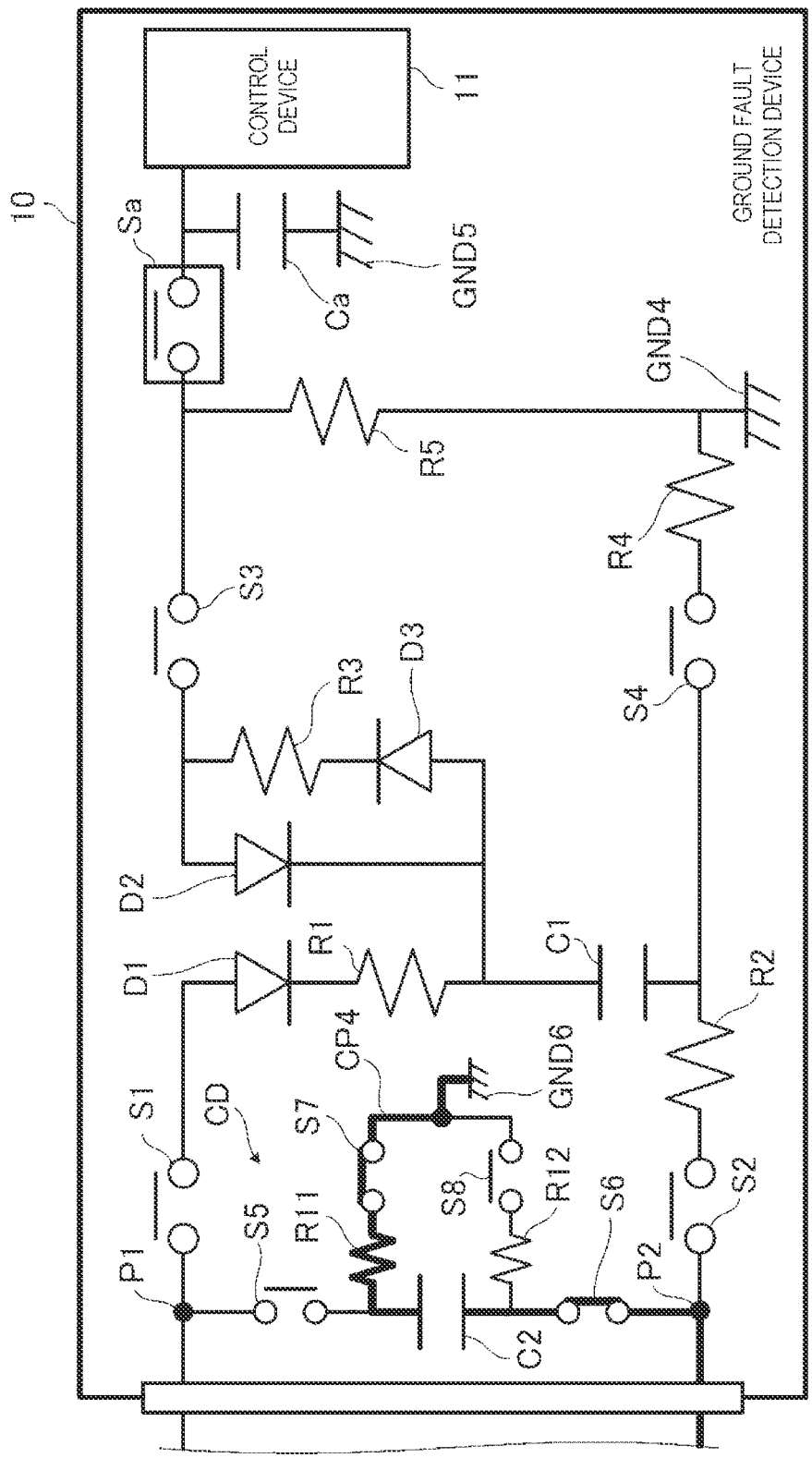
FIG. 9 is a diagram showing an example of a path of a current flowing through the ground fault detection device in a negative electrode side Y capacitor discharge state.

FIG. 9 shows a path (current path) of the current flowing through the ground fault detection device 10 in the negative electrode side Y capacitor discharge state. In FIG. 9, the same portions as those in FIG. 1 are omitted as appropriate.

As shown in the current path CP4 of FIG. 9, when the ground fault detection device 10 is in the negative electrode side Y capacitor discharge state, the electric charges accumulated in the negative electrode side Y capacitor CYn are discharged to the discharge capacitor C2 via the sixth switch S6. The control device 11 maintains the negative electrode side Y capacitor discharge state of the ground fault detection device 10 for a predetermined period (for example, several hundred [ms]).

FIG. 10 shows an example of a change with time of the charging voltage of each of the negative Y capacitor CYn, the discharge capacitor C2, and the detection capacitor C1 when the ground fault detection device 10 is in the negative electrode side Y capacitor discharge state. In FIG. 10, each vertical axis represents voltage, and each horizontal axis represents time.

Figure 10A:
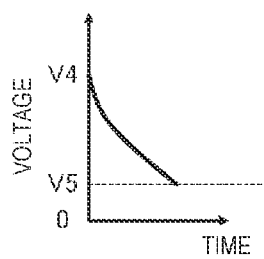
FIG. 10A is a diagram showing an example of a change with time of the charging voltage of the positive electrode side Y capacitor.

As described above, when the ground fault detection device 10 is in the negative electrode side Y capacitor discharge state, the electric charges of the negative electrode side Y capacitor CYn are discharged to the discharge capacitor C2. Therefore, when the ground fault detection device 10 is in the negative electrode side Y capacitor discharge state, the charging voltage of the negative electrode side Y capacitor CYn decreases with time as shown in FIG. 10A. In the example shown in FIG. 10A, the charging voltage of the negative electrode side Y capacitor CYn decreases from V4 to V5.

Figure 10B:
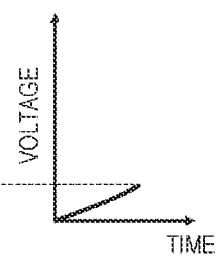
FIG. 10B is a diagram showing an example of a change with time of the charging voltage of the discharge capacitor.

On the other hand, when the ground fault detection device 10 is in the negative electrode side Y capacitor discharge state, the discharge capacitor C2 is charged by the electric charges discharged from the negative electrode side Y capacitor CYn. Therefore, the charging voltage of the discharge capacitor C2 rises with time as shown in FIG. 10B. In the example shown in FIG. 10B, the charging voltage of the discharging capacitor C2 rises from 0 to V5.

Figure 10C:
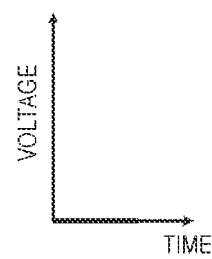
FIG. 10C is a diagram showing an example of a change with time of the charging voltage of the detection capacitor in the ground fault detection device in the negative electrode side Y capacitor discharge state.

When the ground fault detection device 10 is in the negative electrode side Y capacitor discharge state, no current flows through the circuit including the detection capacitor C1. Therefore, the charging voltage of the detection capacitor C1 does not change as shown in FIG. 10C. In the example shown in FIG. 10C, the charging voltage of the detection capacitor C1 remains 0.

Next, the control device 11 turns off the sixth switch S6 and the seventh switch S7 from the negative electrode side Y capacitor discharge state, and turns on the second switch S2 and the third switch S3 (STEP 7). As a result of the process of STEP 7, the ground fault detection device 10 is in a state in which the second switch S2 and the third switch S3 are on and the first switch S1, the fourth switch S4, the fifth switch S5, the sixth switch S6, the seventh switch S7, and the eighth switch S8 are off (hereinafter, also referred to as a negative electrode side voltage measurement state).

Figure 11:
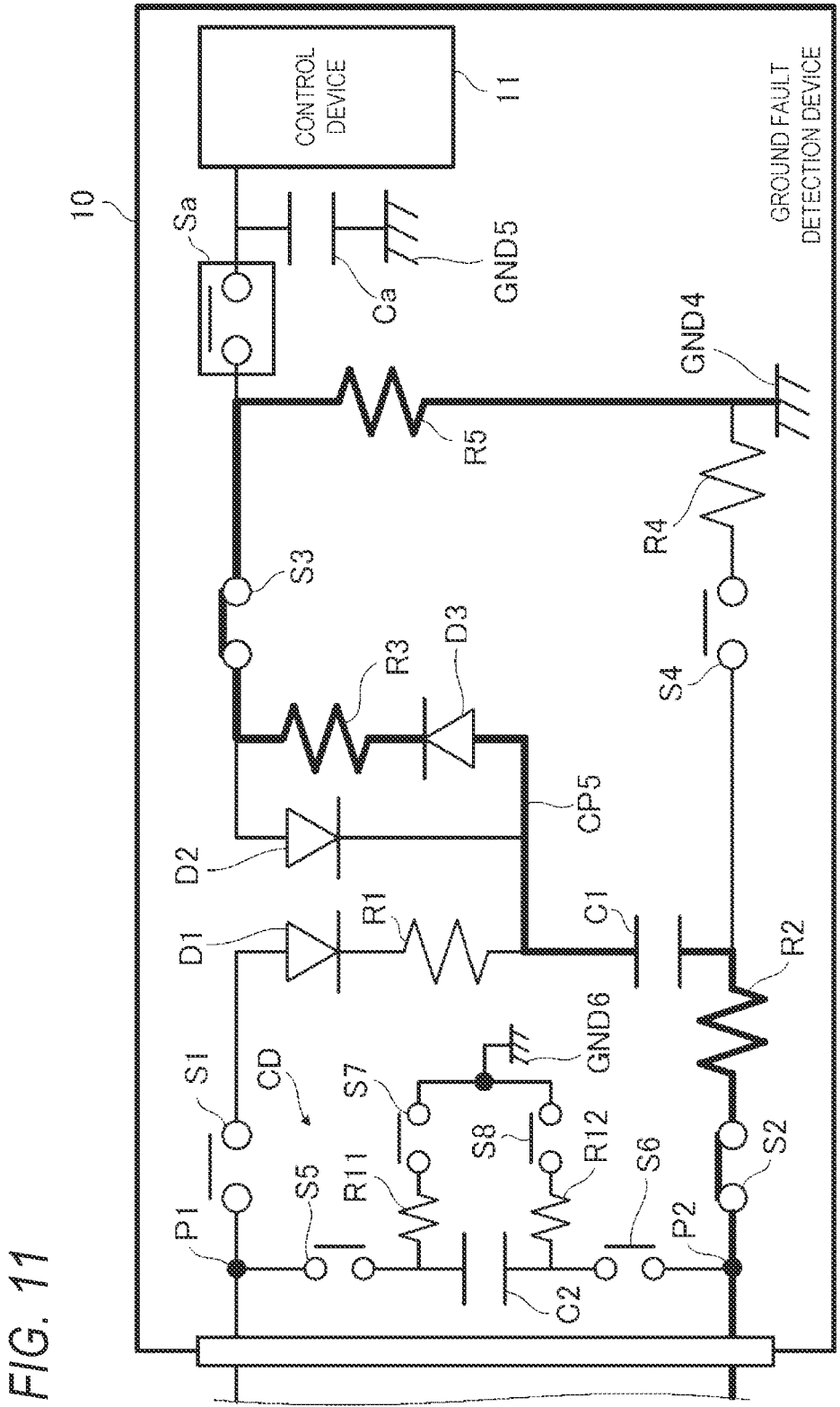
FIG. 11 is a diagram showing an example of a path of a current flowing through the ground fault detection device in the negative electrode side voltage measurement state.

FIG. 11 shows a path (current path) of the current flowing through the ground fault detection device 10 in the negative electrode side voltage measurement state. In FIG. 11, the same portions as those in FIG. 1 are omitted as appropriate.

As shown in the current path CP5 of FIG. 11, when the ground fault detection device 10 is in the negative electrode side voltage measurement state, the detection capacitor C1 is charged according to the voltage between the negative electrode side of the high-voltage battery BAT and the ground GND4. Although not shown in FIG. 11, when the ground fault detection device 10 is in the negative electrode side voltage measurement state, the negative electrode side Y capacitor CYn is also charged in the same manner as the detection capacitor C1. The control device 11 maintains the negative electrode side voltage measurement state of the ground fault detection device 10 for a predetermined period (for example, several hundred [ms]).

FIG. 12 shows an example of a change with time of the charging voltage of each of the negative Y capacitor CYn, the discharge capacitor C2, and the detection capacitor C1 when the ground fault detection device 10 is in the negative electrode side voltage measurement state. In FIG. 12, each vertical axis represents voltage, and each horizontal axis represents time.

Figure 12A:
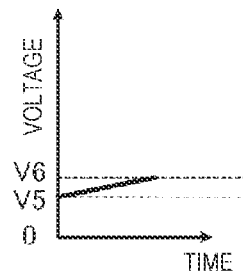
FIG. 12A is a diagram showing an example of a change over tome of the charging voltage of the positive electrode side Y capacitor.
Figure 12B:
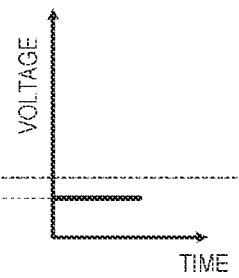
FIG. 12B is a diagram showing an example of a change over tome of the charging voltage of the discharge capacitor.
Figure 12C:
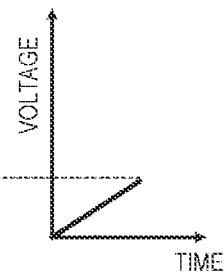
FIG. 12C is a diagram showing an example of a change over tome of the charging voltage of the detection capacitor with time in the ground fault detection device in the negative electrode side voltage measurement state.

As described above, when the ground fault detection device 10 is in the negative electrode side voltage measurement state, the negative electrode side Y capacitor CYn and the detection capacitor C1 are charged according to the voltage between the negative electrode side of the high-voltage battery BAT and the ground GND4. Therefore, when the ground fault detection device 10 is in the negative electrode side voltage measurement state, the charging voltage of the negative electrode side Y capacitor CYn rises with time as shown in FIG. 12A. In the example shown in FIG. 12A, the charging voltage of the positive electrode side Y capacitor CYp rises from V5 to V6. Similarly, the charging voltage of the detection capacitor C1 also rises with time as shown in FIG. 12C. In the example shown in FIG. 12C, the charging voltage of the detection capacitor C1 rises from 0 to V6.

When the ground fault detection device 10 is in the negative electrode side voltage measurement state, no current flows through the discharge circuit CD including the discharge capacitor C2. Therefore, the charging voltage of the discharging capacitor C2 does not change as shown in FIG. 12B. In the example shown in FIG. 12B, the charging voltage of the discharging capacitor C2 remains V5.

When a predetermined period elapses after the ground fault detection device 10 is in the negative electrode side voltage measurement state, the charging voltage of the detection capacitor C1 becomes equal to the charging voltage of the negative electrode side Y capacitor CYn (for example, refer to V6 in FIG. 12 and FIG. 12C). The charging voltage of the detection capacitor C1 at this time is hereinafter referred to as Vcn. The control device 11 measures the charging voltage of the detection capacitor C1 as Vcn when a predetermined period of time has elapsed since the ground fault detection device 10 is in the negative electrode side voltage measurement state (STEP S8).

Next, the control device 11 turns off the third switch S3 from the negative electrode side voltage measurement state, and turns on the first switch S1, the seventh switch S7, and the eighth switch S8 (STEP S9). As a result of the process of STEP 9, the ground fault detection device 10 is in the overall voltage measurement state shown in FIG. 7. Then, similarly to STEP 5, the control device 11 measures the charging voltage of the detection capacitor C1 as V0 when a predetermined period has elapsed since the ground fault detection device 10 is in the overall voltage measurement state (STEP 10).

Next, the control device 11 calculates an evaluation value LKRATE of the insulation resistance in the vehicle 1 based on Vcp measured in STEP S3, Vcn measured in STEP S8, and V0 measured in STEP 5 or STEP S10 (STEP 11). The evaluation value LKRATE is, for example, a value calculated by dividing the sum of Vcn and Vcp by V0.

Then, the control device 11 detects a ground fault based on the evaluation value LKRATE calculated in STEP 11 and an insulation resistance map stored in advance in the control device 11 (STEP 12), and ends the process shown in FIG. 2. In the insulation resistance map, for example, information indicating an evaluation value LKRATE (insulation resistance value) which is a condition for determining that a ground fault has occurred is stored.

As described above, the control device 11 of the ground fault detection device 10 causes the electric charges of the positive electrode side Y capacitor CYp to be discharged to the discharge capacitor C2 as the positive electrode side Y capacitor discharge state before the ground fault detection device 10 is in the positive electrode side voltage measurement state. As a result, the amount of electric charges flowing into the detection capacitor C1 from the positive electrode side Y capacitor CYp can be reduced when the positive electrode side voltage measurement state is set. As a result, Vcp which is less affected by the electric charges of the positive electrode side Y capacitor CYp can be measured, and the detection accuracy of the ground fault based on Vcp can be improved.

In addition, the control device 11 causes the discharge capacitor C2 to discharge the electric charges of the negative electrode side Y capacitor CYn as the negative electrode side Y capacitor discharge state before the ground fault detection device 10 is in the negative electrode side voltage measurement state. Thus, when the negative electrode side voltage measurement state is set, the electric charges flowing from the negative electrode side Y capacitor CYn into the detection capacitor C1 can be reduced. As a result, Vcn which is less affected by the electric charges of the negative electrode side Y capacitor CYn can be measured, and the detection accuracy of the ground fault based on Vcn can be improved.

In the ground fault detection device 10, one end (connection point P1) of the discharge circuit CD is provided on the positive electrode side Y capacitor CYp side of the first resistor R1. Thereby, the electric charges of the positive electrode side Y capacitor CYp can be discharged to the discharge capacitor C2 without passing through the first resistor R1. Therefore, when a resistor having a large electric resistance value is used as the first resistor R1, it is possible to suppress that it takes a long time to discharge the electric charges of the positive electrode side Y capacitor CYp to the discharge capacitor C2.

In the ground fault detection device 10, the other end (connection point P2) of the discharge circuit CD is provided on the negative electrode side Y capacitor CYn side of the second resistor R2. Thereby, the electric charges of the negative electrode side Y capacitor CYn can be discharged to the discharge capacitor C2 without passing through the second resistor R2. Therefore, when a resistor having a large electric resistance value is used as the second resistor R2, it is possible to suppress that it takes a long time to discharge the electric charges of the negative electrode side Y capacitor CYn to the discharge capacitor C2.

[First Modification]

Next, a first modification of the ground fault detection device 10 of the above-described embodiment will be described. In the following description of the first modification, the same portions as those of the above-described embodiment are denoted by the same reference numerals as those of the above-described embodiment, and the description thereof will be appropriately omitted.

Figure 13:
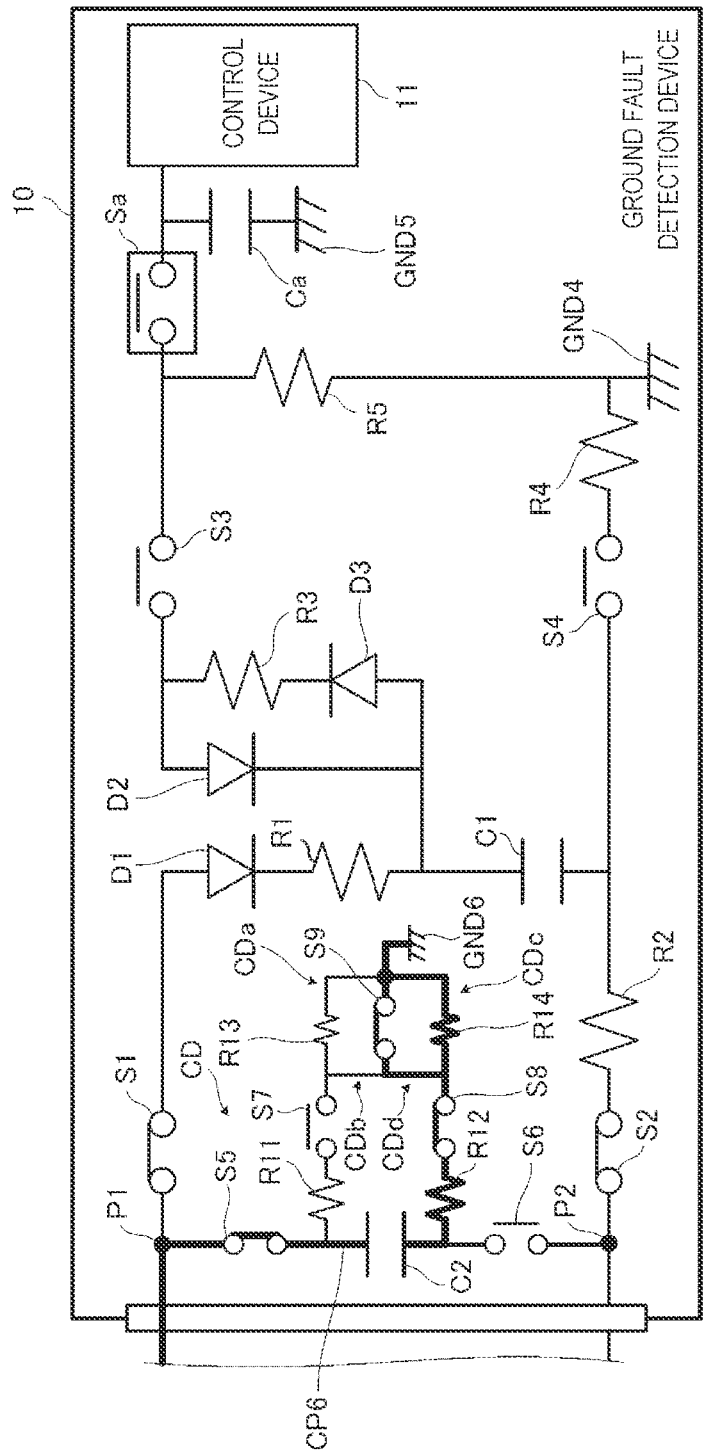
FIG. 13 is a diagram showing a first modification of the ground fault detection device according to the embodiment of the present invention.

As shown in FIG. 13, in the ground fault detection device 10 of the first modification, the discharge circuit CD further includes a third discharge resistor R13, a fourth discharge resistor R14, and a ninth switch S9.

The third discharge resistor R13 and the fourth discharge resistor R14 are resistors having a predetermined electrical resistance value. Here, as the third discharge resistor R13 and the fourth discharge resistor R14, a resistor having an electrical resistance value larger than that of the first discharge resistor R11 and the second discharge resistor R12, for example, a resistor having an electrical resistance value of about several hundred [kΩ] is used. The ninth switch S9 is, for example, an insulated switching element such as an optical MOSFET.

In the discharge circuit CD of the first modification, one end of the seventh switch S7 is connected to the first discharge resistor R11. The other end of the seventh switch S7 is connected to one end of the third discharge resistor R13 and one end of the ninth switch S9. The other end of the third discharge resistor R13 is connected to the ground GND6 and the other end of the ninth switch S9.

That is, the other end of the seventh switch S7 is provided with a circuit CDa that connects the other end of the seventh switch S7 and the ground GND6 by the third discharge resistor R13, and a circuit CDb that connects the other end of the seventh switch S7 and the ground GND6 by the ninth switch S9.

In the discharge circuit CD of the first modification, one end of the eighth switch S8 is connected to the second discharge resistor R12. The other end of the eighth switch S8 is connected to one end of the fourth discharge resistor R14 and one end of the ninth switch S9. The other end of the fourth discharge resistor R14 is connected to the ground GND6 and the other end of the ninth switch S9.

That is, the other end of the eighth switch S8 is provided with a circuit CDc that connects the other end of the eighth switch S8 and the ground GND6 by the fourth discharge resistor R14, and a circuit CDd that connects the other end of the eighth switch S8 to the ground GND6 by the ninth switch S9.

In the first modification, when the positive electrode side Y capacitor discharge state is set when the vehicle 1 is charged by the charger 20, the control device 11 turns on the ninth switch S9 in addition to the fifth switch S5 and the eighth switch S8 as shown in FIG. 13. In this case, as indicated by the current path CP6 in FIG. 13, the circuit CDc and the circuit CDd are in a conductive state.

On the other hand, although not shown, in the first modification, when the vehicle 1 is not charged by the charger 20 (for example, when the vehicle 1 is running), the control device 11 turns on the fifth switch S5 and the eighth switch S8, and turns off the ninth switch S9. In this case, the circuit CDc is in the conductive state, but the circuit CDd is in a non-conductive state.

Thus, according to the ground fault detection device 10 of the first modification, the discharge resistance from the positive electrode side Y capacitor CYp to the discharge capacitor C2 when the positive electrode side Y capacitor discharge state is set can be changed between w % ben the vehicle 1 is charged by the charger 20 and when the vehicle 1 is not charged by the charger 20. Specifically, the discharge resistance when the vehicle 1 is not charged by the charger 20 (for example, while the vehicle 1 is running) can be made larger than the discharge resistance when the vehicle 1 is charged by the charger 20.

That is, according to the ground fault detection device 10 of the first modification, the discharge amount from the positive electrode side Y capacitor CYp to the discharge capacitor C2 when the positive electrode side Y capacitor discharge state is set when the vehicle is not charged by the charger 20 can be limited to be smaller than the discharge amount when the positive electrode side Y capacitor discharge state is set when the vehicle is charged by the charger 20.

Therefore, according to the ground fault detection device 10 of the first modification, it is possible to prevent the charging voltage (that is, the potential) of the positive electrode side Y capacitor CYp from being excessively lowered when the positive electrode side Y capacitor discharge state is set when the vehicle is not charged by the charger 20. Then, by preventing the charging voltage of the positive electrode side Y capacitor CYp from being excessively lowered in the positive electrode side Y capacitor discharge state, it is possible to shorten the time required to charge the detection capacitor C1 when the positive electrode side voltage measurement state is set.

Specifically, when the ground fault detection device 10 is in the positive electrode side voltage measurement state, the detection capacitor C1 whose charge voltage at that time is lower than that of the positive electrode side Y capacitor CYp is first charged. When the charging voltage of the detection capacitor C1 becomes equal to the charging voltage of the positive electrode side Y capacitor CYp, the detection capacitor C1 and the positive electrode side Y capacitor CYp are simultaneously charged. When the detection capacitor C1 and the positive electrode side Y capacitor CYp are simultaneously charged, the amount of charge per unit time of the detection capacitor C1 is smaller than that when only the detection capacitor C1 is charged.

When the charging voltage of the positive electrode side Y capacitor CYp is too low in the positive electrode side Y capacitor discharge state, the charging voltage of the detection capacitor C1 and the charging voltage of the positive electrode side Y capacitor CYp become equal at an early timing after the ground fault detection device 10 is in the positive electrode side voltage measurement state, and the speed at which the detection capacitor C1 is charged decreases. As a result, the time required to complete the charging of the detection capacitor C1 in the positive electrode side voltage measurement state becomes long.

In contrast, according to the ground fault detection device 10 of the first modification, as described above, the charging voltage of the positive electrode side Y capacitor CYp can be prevented from being excessively lowered in the positive electrode side Y capacitor discharge state, and thus it is possible to shorten the time required to charge the detection capacitor C1 when the positive electrode side voltage measurement state is set.

Although not shown, in the first modification, when the vehicle 1 is charged by the charger 20, the control device 11 turns on the ninth switch S9 in addition to the sixth switch S6 and the seventh switch S7. In this case, the circuit formed by the ninth switch S9 is in the conductive state.

On the other hand, in the first modification, the control device 11 turns on the sixth switch S6 and the seventh switch S7 and turns off the ninth switch S9 when the negative electrode side Y capacitor discharge state is set when the vehicle 1 is not charged by the charger 20, such as while the vehicle 1 is running. In this case, the circuit formed by the ninth switch S9 is in the non-conduction state.

Thus, according to the ground fault detection device 10 of the first modification, the discharge resistance from the negative electrode side Y capacitor CYn to the discharge capacitor C2 when the negative electrode side Y capacitor discharge state is set can be changed between when the vehicle 1 is charged by the charger 20 and when the vehicle 1 is not charged by the charger 20. Specifically, the discharge resistance when the vehicle 1 is not charged by the charger 20 (for example, while the vehicle 1 is running) can be made larger than the discharge resistance when the vehicle 1 is charged by the charger 20.

That is, according to the ground fault detection device 10 of the first modification, the discharge amount from the negative electrode side Y capacitor CYn to the discharge capacitor C2 when the negative electrode side Y capacitor discharge state is set when the vehicle is not charged by the charger 20 can be limited to be smaller than that when the negative electrode side Y capacitor discharge state is set when the vehicle is charged by the charger 20.

Therefore, according to the ground fault detection device 10 of the first modification, it is possible to prevent the charging voltage (that is, the potential) of the negative electrode side Y capacitor CYn from being excessively lowered when the negative electrode side Y capacitor discharge state is set when the vehicle is not charged by the charger 20. In addition, by preventing the charging voltage of the negative electrode side Y capacitor CYn from being excessively lowered in the negative electrode side Y capacitor discharge state, it is possible to shorten the time required to charge the detection capacitor C1 when the negative electrode side voltage measurement state is set.

As described above, according to the ground fault detection device 10 of the first modification, it is possible to shorten the time required to charge the detection capacitor C1 when the positive electrode side voltage measurement state or the negative electrode side voltage measurement state is set, and thus it is possible to shorten the time taken for the measurement of Vcp and Vcn described above, and shorten the time required to detect the ground fault.

[Second Modification]

Next, a second modification of the ground fault detection device 10 of the above-described embodiment will be described. In the following description of the second modification, the same portions as those of the above-described embodiment are denoted by the same reference numerals as those of the above-described embodiment, and the description thereof will be appropriately omitted.

Figure 14:
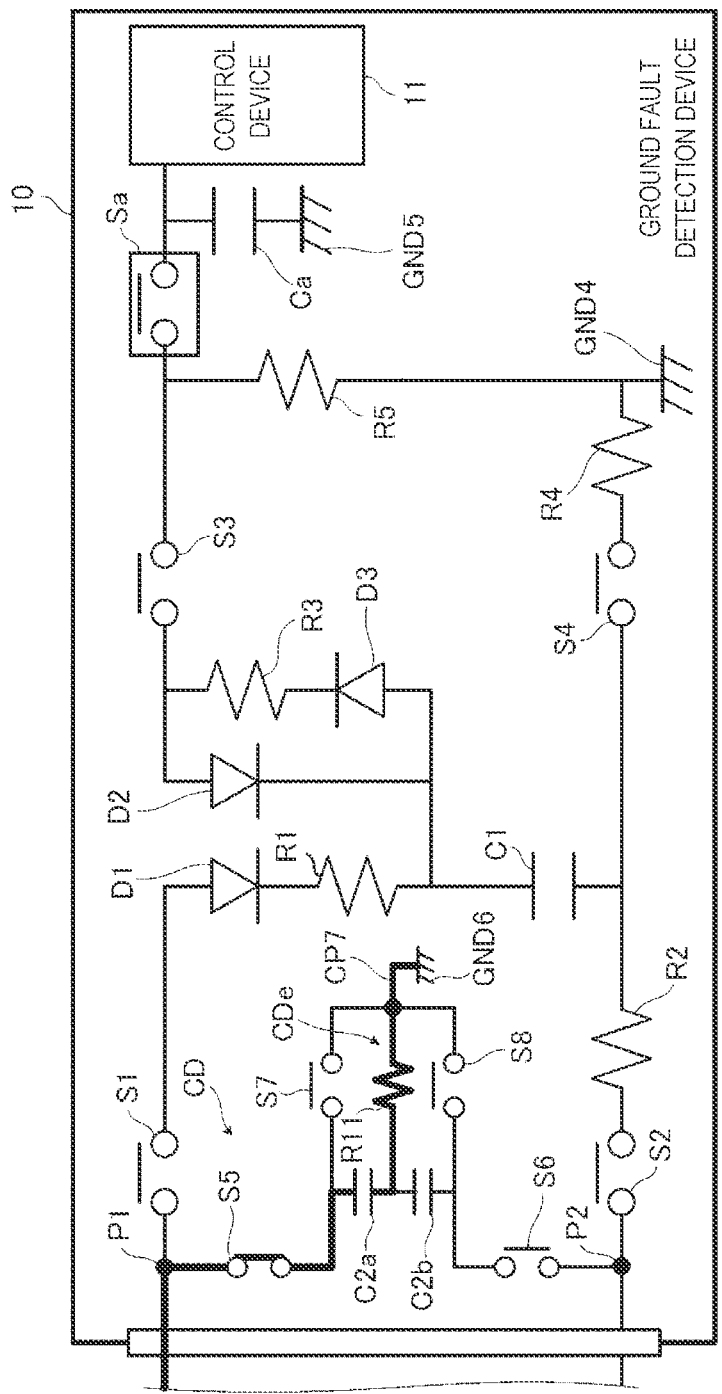
FIG. 14 is a diagram showing a second modification of the ground fault detection device according to the embodiment of the present invention.

As shown in FIG. 14, in the ground fault detection device 10 of the second modification, the discharge circuit CD includes a first discharge capacitor C2a, a second discharge capacitor C2b, a fifth switch S5, a sixth switch S6, a seventh switch S7, an eighth switch S8, and a first discharge resistor R11.

The first discharge capacitor C2a and the second discharge capacitor C2b are capacitors having a predetermined capacitance. In the second modification, a resistor having an electric resistance value smaller than that of the first resistor R1, for example, a resistor having an electric resistance value of about several [kΩ] is used as the first discharge resistor R11. Accordingly, the electric charges of the discharge capacitor C2 can be quickly discharged while suppressing the occurrence of a ground fault in the vehicle 1.

In the second modification, the other end of the fifth switch S5 is connected to one end of the first discharge capacitor C2a and one end of the seventh switch S7. The other end of the first discharge capacitor C2a is connected to one end of the first discharge resistor R11. The other end of the first discharge resistor R11 is connected to the ground GND6. The other end of the seventh switch S7 is connected to the ground GND6.

In the second modification, the other end of the sixth switch S6 is connected to one end of the second discharge capacitor C2b and one end of the eighth switch S8. The other end of the second discharge capacitor C2b is connected to the other end of the first discharge capacitor C2a and one end of the first discharge resistor R11. The other end of the eighth switch S8 is connected to the ground GND6.

In the second modification, a circuit that connects the other end of the first discharge capacitor C2a and the other end of the second discharge capacitor C2b and the ground GND6 is referred to as a circuit CDe. That is, in the second modification, the circuit CDe is the first discharge resistor R11.

In the second modification, the control device 11 turns on the fifth switch S5 and turns off other switches when the positive electrode side Y capacitor discharge state is set. As a result, as shown in the current path CP7 of FIG. 14, the electric charges of the positive electrode side Y capacitor CYp can be discharged to the first discharge capacitor C2a Therefore, as in the above-described embodiment, the electric charges of the positive electrode side Y capacitor CYp that flows into the detection capacitor C1 when the positive electrode side Y capacitor discharge state is in the positive electrode side voltage measurement state can be reduced.

Although illustration and detailed description are omitted, in the second modification, the control device 11 turns on the sixth switch S6 and turns off other switches when the negative electrode side Y capacitor discharge state is set. Thereby, the electric charges of the negative electrode side Y capacitor CYn can be discharged to the second discharge capacitor C2b. Therefore, as in the above-described embodiment, the electric charges of the negative electrode side Y capacitor CYn that flows into the detection capacitor C1 when the negative electrode side Y capacitor discharge state is in the negative electrode side voltage measurement state can be reduced.

[Third Modification]

Next, a third modification of the ground fault detection device 10 of the above-described embodiment will be described. In the following description of the third modification, the same portions as those of the above-described embodiment, the first modification, and the second modification are denoted by the same reference numerals, and the description thereof will be appropriately omitted.

Figure 15:
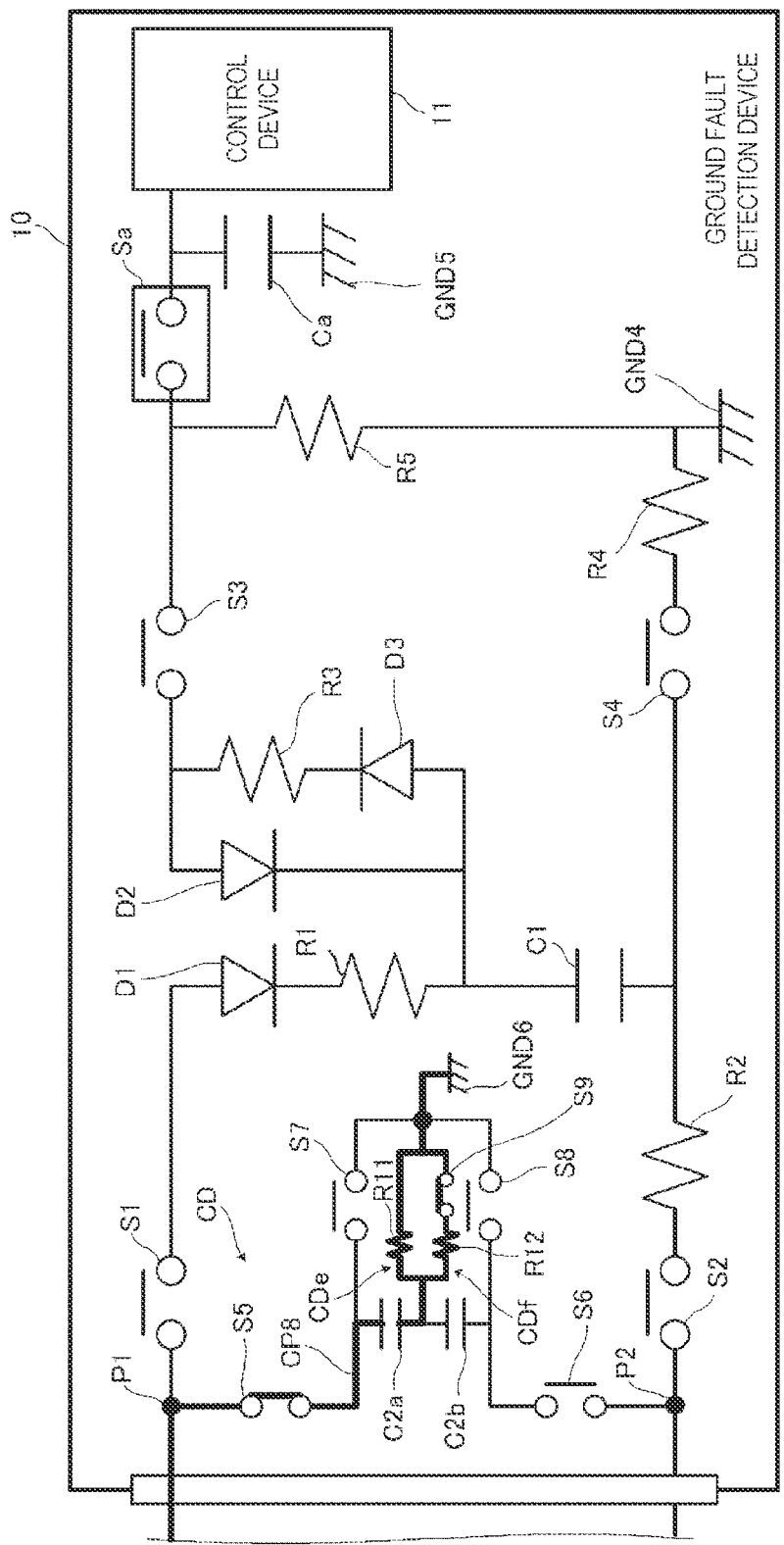
FIG. 15 is a diagram showing a third modification of the ground fault detection device according to the embodiment of the present invention.

As shown in FIG. 15, in the ground fault detection device 10 of the third modification, the discharge circuit CD includes a first discharge capacitor C2a, a second discharge capacitor C2b, a fifth switch S5, a sixth switch S6, a seventh switch S7, an eighth switch S8, a first discharge resistor R11, a second discharge resistor R12, and a ninth switch S9.

In the third modification, a resistor having an electrical resistance value of, for example, about several hundred [kΩ] is used as the first discharge resistor R11. In the third modification, as the second discharge resistor R12, a resistor having an electrical resistance value smaller than that of the first discharge resistor R11, for example, a resistor having an electrical resistance value of about several [kΩ] is used. Thus, when the ninth switch S9 is turned on, the discharge resistance from the positive electrode side Y capacitor CYp or the negative electrode side Y capacitor CYn can be made smaller than that when the ninth switch S9 is turned off. In other words, the discharge resistance from the positive electrode side Y capacitor CYp or the negative electrode side Y capacitor CYn can be made larger when the ninth switch S9 is turned off than that when the ninth switch S9 is turned on.

In the third modification, the other end of the fifth switch S5 is connected to one end of the first discharge capacitor C2a and one end of the seventh switch S7. The other end of the first discharge capacitor C2a is connected to one end of the first discharge resistor R11 and one end of the second discharge resistor R12. The other end of the first discharge resistor R11 is connected to the ground GND6. The other end of the second discharge resistor R12 is connected to one end of the ninth switch S9. The other end of the ninth switch S9 is connected to the ground GND6. The other end of the seventh switch S7 is also connected to the ground GND6.

In the third modification, the other end of the sixth switch S6 is connected to one end of the second discharge capacitor C2b and one end of the eighth switch S8. The other end of the second discharge capacitor C2b is connected to the other end of the first discharge capacitor C2a and one end of the first discharge resistor R11, and one end of the second discharge resistor R12. The other end of the eighth switch S8 is connected to the ground GND6.

In the third modification, a circuit that connects the other end of the first discharge capacitor C2a and the other end of the second discharge capacitor C2b and the ground GND6 is referred to as a circuit CDe and a circuit CDf. That is, in the third modification, the circuit CDe and the circuit CDf are connected in parallel, the circuit CDe is the first discharge resistor R11, and the circuit CDf is the second discharge resistor R12 and the ninth switch S9 which are connected in series.

In the third modification, when the positive electrode side Y capacitor discharge state is set when the vehicle 1 is charged by the charger 20, the control device 11 turns on the ninth switch S9 in addition to the fifth switch S5, as shown in FIG. 15. In this case, as shown in the current path CP8 in FIG. 15, the circuit CDe and the circuit CDf are in the conductive state.

On the other hand, although not shown, in the third modification, when the positive electrode side Y capacitor discharge state is set when the vehicle 1 is not charged by the charger 20 while the vehicle 1 is running, the control device 11 turns on the fifth switch S5 and turns off the ninth switch S9. In this case, the circuit CDe is in the conductive state, but the circuit CDf is in the non-conductive state.

Thus, according to the ground fault detection device 10 of the third modification, the discharge resistance from the positive electrode side Y capacitor CYp to the first discharge capacitor C2a when the positive electrode side Y capacitor discharge state is set can be changed between when the vehicle 1 is charged by the charger 20 and when the vehicle 1 is not charged by the charger 20. Specifically, the discharge resistance when the vehicle 1 is not charged by the charger 20 (for example, while the vehicle 1 is running) can be made larger than the discharge resistance when the vehicle 1 is charged by the charger 20.

Therefore, according to the ground fault detection device 10 of the third modification, it is possible to prevent the charging voltage (that is, the potential) of the positive electrode side Y capacitor CYp from being excessively lowered when the positive electrode side Y capacitor discharge state is set when the battery is not charged by the charger 20. Then, by preventing the charging voltage of the positive electrode side Y capacitor CYp from being excessively lowered in the positive electrode side Y capacitor discharge state, it is possible to shorten the time required to charge the detection capacitor C1 when the positive electrode side voltage measurement state is set.

Although not shown, in the third modification, when the vehicle 1 is charged by the charger 20, the control device 11 turns on the ninth switch S9 in addition to the sixth switch S6. In this case, a circuit including the second discharge resistor R12 and the ninth switch S9 connected in series is in the conductive state.

On the other hand, in the third modification, when the vehicle 1 is not charged by the charger 20 (for example, when the vehicle 1 is running), the control device 11 turns on the sixth switch S6 and turns off the ninth switch S9. In this case, the circuit including the second discharge resistor R12 and the ninth switch S9 is in the non-conductive state.

Thus, according to the ground fault detection device 10 of the third modification, the discharge resistance from the negative electrode side Y capacitor CYn to the second discharge capacitor C2b when the negative electrode side Y capacitor discharge state is set can be changed between when the vehicle 1 is charged by the charger 20 and when the vehicle 1 is not charged by the charger 20. Specifically, the discharge resistance when the vehicle 1 is not charged by the charger 20 (for example, while the vehicle 1 is running) can be made larger than the discharge resistance when the vehicle 1 is charged by the charger 20.

Therefore, according to the ground fault detection device 10 of the third modification, it is possible to prevent the charging voltage (that is, the potential) of the negative electrode side Y capacitor CYn from being excessively lowered when the negative electrode side Y capacitor discharge state is set when the vehicle is not charged by the charger 20. In addition, by preventing the charging voltage of the negative electrode side Y capacitor CYn from being excessively lowered in the negative electrode side Y capacitor discharge state, it is possible to shorten the time required to charge the detection capacitor C1 when the negative electrode side voltage measurement state is set.

As described above, according to the ground fault detection device 10 of the third modification, the time required to charge the detection capacitor C1 when the positive electrode side voltage measurement state or the negative electrode side voltage measurement state is set can be shortened.

The present invention is not limited to the embodiments described above, and modifications, improvements, or the like can be made as appropriate.

For example, although the vehicle 1 is an electric automatic vehicle or a hybrid electric vehicle in the above-described embodiments, the vehicle 1 may be a fuel cell vehicle.

At least the following matters are described in the present description. Components and the like corresponding to the above-described embodiments are shown in parentheses, but the present invention is not limited thereto.

(1) A ground fault detection device (ground fault detection device 10) connected to a high-voltage battery (high-voltage battery BAT) and configured to detect a decrease in insulation resistance of a system provided with the high-voltage battery, the ground fault detection device including:

a detection capacitor (detection capacitor C1) operating as a flying capacitor;

a control unit (control device 11) measuring a voltage of the detection capacitor;

a first switch (first switch S1) and a first resistor (first resistor R1) connecting a positive electrode side of the high-voltage battery and one end of the detection capacitor in series;

a second switch (second switch S2) and a second resistor (second resistor R2) connecting the negative electrode side of the high-voltage battery and an another end of the detection capacitor in series;

a third switch (third switch S3) connecting the one end of the detection capacitor and a ground;

a fourth switch (fourth switch S4) connecting the other end of the detection capacitor and the ground; and a discharge circuit (discharge circuit CD) including at least a discharge capacitor (discharge capacitor C2) and having one end and an another end, the one end (connection point P1) of the discharge circuit being connected to the positive electrode side of the high-voltage battery and the another end (connection point P2) of the discharge circuit being connected to the negative electrode side of the high-voltage battery, in which the ground fault detection device is connected to:

a positive electrode side termination resistor (positive electrode side termination resistor Risp) connecting the positive electrode side of the high-voltage battery and the ground.

a negative electrode side termination resistor (negative electrode side termination resistor Risn) connecting the negative electrode side of the high-voltage battery and the ground, a positive electrode side Y capacitor (positive electrode side Y capacitor CYp) connecting the positive electrode side of the high-voltage battery and the ground in parallel with the positive electrode side termination resistor, and a negative electrode side Y capacitor (negative electrode side Y capacitor CYn) connecting the negative electrode side of the high voltage battery and the ground in parallel with the negative electrode side termination resistor, in which the one end of the discharge circuit is connected to a point closer to the positive electrode side Y capacitor than the first resistor, and the another end of the discharge circuit is connected to a point closer to the negative electrode side Y capacitor than the second resistor, in which the discharge circuit includes:

a fifth switch (fifth switch S5) that is provided at the one end of the discharge circuit and connects one end of the discharge capacitor and the positive electrode side Y capacitor;

a sixth switch (sixth switch S6) that is provided at the another end of the discharge circuit and connects an another end of the discharge capacitor and the negative electrode side Y capacitor:

a first discharge resistor (first discharge resistor R11) and a seventh switch (seventh switch S7) that connect the one end of the discharge capacitor and the ground in series; and a second discharge resistor (second discharge resistor R12) and an eighth switch (eighth switch S8) that connect the another end of the discharge capacitor and the ground in series.

According to (1), since the one end of the discharge circuit including the discharge capacitor is connected to the positive electrode side of the high-voltage battery, the electric charges of the positive electrode side Y capacitor can be discharged to the discharge capacitor. Accordingly, when the positive electrode side Y capacitor and the detection capacitor are connected, the electric charges flowing into the detection capacitor from the positive electrode side Y capacitor can be reduced. Furthermore, since the one end of the discharge circuit is connected to the point closer to the positive electrode side Y capacitor than the first resistor, the electric charges of the positive electrode side Y capacitor can be discharged to the discharge capacitor without passing through the first resistor.

According to (1), since the another end of the discharge circuit including the discharge capacitor is connected to the negative electrode side of the high-voltage battery, the electric charges of the negative electrode side Y capacitor can be discharged to the discharge capacitor. Accordingly, when the negative electrode side Y capacitor and the detection capacitor are connected, the electric charges flowing into the detection capacitor from the negative electrode side Y capacitor can be reduced. Further, since the another end of the discharge circuit is connected to a point closer to the negative electrode side Y capacitor than the second resistor, the electric charges of the negative electrode side Y capacitor can be discharged to the discharge capacitor without passing through the second resistor.

(2) The ground fault detection device according to (1), in which an electrical resistance value of the second discharge resistor is smaller than an electrical resistance value of the first resistor.

According to (2), since the electric resistance value of the second discharge resistor is smaller than the electric resistance value of the first resistor, it is possible to shorten the time required to discharge the positive electrode side Y capacitor.

(3) The ground fault detection device according to (1) or (2), in which an electrical resistance value of the first discharge resistor is smaller than an electrical resistance value of the second resistor.

According to (3), since the electric resistance value of the first discharge resistor is smaller than the electric resistance value of the second resistor, it is possible to shorten the time required to discharge the negative electrode side Y capacitor.

(4) The ground fault detection device according to any one of (1) to (3), in which the discharge circuit further includes a first circuit and a second circuit that connect the second discharge resistor and the eighth switch to the ground, the first circuit and the second circuit are connected in parallel, the first circuit includes a third discharge resistor, and the second circuit includes a ninth switch.

According to (4), the discharge circuit further includes the first circuit and the second circuit that connect the second discharge resistor and the eighth switch to the ground, and the first circuit and the second circuit are connected in parallel. The first circuit includes a third discharge resistor, and the second circuit includes a ninth switch. As a result, the discharge resistance from the positive electrode side Y capacitor or the negative electrode side Y capacitor to the discharge capacitor can be changed between when the ninth switch is turned on and when the ninth switch is turned off.

(5) A ground fault detection device connected to a high-voltage battery and configured to detect a decrease in insulation resistance of a system provided with the high-voltage battery, the ground fault detection device including:

a detection capacitor operating as a flying capacitor;

a control unit measuring a voltage of the detection capacitor;

a first switch and a first resistor connecting a positive electrode side of the high-voltage battery and one end of the detection capacitor in series;

a second switch and a second resistor connecting the negative electrode side of the high-voltage battery and an another end of the detection capacitor in series;

a third switch connecting the one end of the detection capacitor and a ground;

a fourth switch connecting the another end of the detection capacitor and the ground; and a discharge circuit including at least a first discharge capacitor and a second discharge capacitor and having one end on a first discharge capacitor side and an another end on a second discharge capacitor side, the one end of the discharge circuit being connected to a positive electrode side of the high-voltage battery, and the another end of the discharge circuit being connected to a negative electrode side of the high-voltage battery, in which the ground fault detection device is connected to:

a positive electrode side termination resistor connecting a positive electrode side of the high-voltage battery and the ground, a negative electrode side termination resistor connecting the negative electrode side of the high-voltage battery and the ground, a positive electrode side Y capacitor connecting the positive electrode side of the high-voltage battery and the ground in parallel with the positive electrode side terminal resistor, and a negative electrode side Y capacitor connecting the negative electrode side of the high-voltage battery and the ground in parallel with the negative electrode side termination resistor, in which the one end of the discharge circuit is connected to a point closer to the positive electrode side Y capacitor than the first resistor, and the another end of the discharge circuit is connected to a point closer to the negative electrode side Y capacitor than the second resistor, in which the discharge circuit includes:

a fifth switch that is provided at the one end of the discharge circuit and connects one end of the first discharge capacitor to the positive electrode side Y capacitor;

a sixth switch that is provided at the another end of the discharge circuit and connects one end of the second discharge capacitor to the negative electrode side Y capacitor:

a seventh switch that connects the one end of the first discharge capacitor and the ground;

an eighth switch that connects the one end of the second discharge capacitor and the ground; and a first circuit that connects an nother end of the first discharge capacitor and an another end of the second discharge capacitor to the ground, and in which the first circuit includes a first discharge resistor.

According to (5), since the one end of the discharge circuit, which includes the first discharge capacitor and the second discharge capacitor and has the one end on the first discharge capacitor side, is connected to the positive electrode side of the high-voltage battery, the electric charges of the positive electrode side Y capacitor can be discharged to the first discharge capacitor. Accordingly, when the positive electrode side Y capacitor and the detection capacitor are connected, the electric charges flowing into the detection capacitor from the positive electrode side Y capacitor can be reduced. Furthermore, since the one end of the discharge circuit is connected to the point closer to the positive electrode side Y capacitor than the first resistor, the electric charges of the positive electrode side Y capacitor can be discharged to the first discharge capacitor without passing through the first resistor.

According to (5), since the another end of the discharge circuit, which includes the first discharge capacitor and the second discharge capacitor and has the another end on the second discharge capacitor side, is connected to the negative electrode side of the high-voltage battery, the electric charges of the negative electrode side Y capacitor can be discharged to the second discharge capacitor. Accordingly, when the negative electrode side Y capacitor and the detection capacitor are connected, the electric charges flowing into the detection capacitor from the negative electrode side Y capacitor can be reduced. Further, since the another end of the discharge circuit is connected to the point closer to the negative electrode side Y capacitor than the second resistor, the electric charges of the negative electrode side Y capacitor can be discharged to the discharge capacitor without passing through the second resistor.

(6) The ground fault detection device according to (5), in which an electrical resistance value of the first discharge resistor is smaller than an electrical resistance value of the first resistor.

According to (6), since the electric resistance value of the first discharge resistor is smaller than the electric resistance value of the first resistor, it is possible to shorten the time required to discharge the positive electrode side Y capacitor or the negative electrode side Y capacitor.

(7) The ground fault detection device according to (5) or (6), in which the discharge circuit further includes a second circuit that connects the another end of the first discharge capacitor and the another end of the second discharge capacitor to the ground and is connected in parallel with the first circuit, and the second circuit includes a second discharge resistor having an electrical resistance value different from an electrical resistance value of the first discharge resistor and a ninth switch.

According to (7), the discharge circuit further includes a second circuit that connects the another end of the first discharge capacitor and the another end of the second discharge capacitor to the ground and is connected in parallel with the first circuit, and the second circuit includes the second discharge resistor having different electrical resistance values from the first discharge resistor and the ninth switch. Accordingly, the discharge resistance from the positive electrode side Y capacitor to the first discharge capacitor and the discharge resistance from the negative electrode side Y capacitor to the second discharge capacitor can be changed between when the ninth switch is turned on and when the ninth switch is turned off.

(8) The ground fault detection device according to (7), in which an electrical resistance value of the second discharge resistor is smaller than the electrical resistance value of the first discharge resistor.

According to (8), since the electrical resistance value of the second discharge resistor is smaller than the electrical resistance value of the first discharge resistor, the discharge resistance when the ninth switch is turned on can be made smaller than the discharge resistance when the ninth switch is turned off. In other words, the discharge resistance when the ninth switch is turned off can be made larger than the discharge resistance when the ninth switch is turned on.

What is claimed is:

1. A ground fault detection device connected to a system provided with a high-voltage battery and configured to detect a decrease in insulation resistance of the system, the system comprising: the high-voltage battery; a positive electrode side power line to which a positive electrode terminal of the high-voltage battery is connected; a negative electrode side power line to which a negative electrode terminal of the high-voltage battery is connected; a positive electrode side termination resistor and a positive electrode side Y capacitor connected in parallel with each other between the positive electrode side power line and a ground; and a negative electrode side termination resistor and a negative electrode side Y capacitor connected in parallel with each other between the negative electrode side power line and the ground, and the ground fault detection device comprising:

a detection capacitor operating as a flying capacitor;

a control unit measuring a voltage of the detection capacitor;

a first switch and a first resistor connected in series with each other between the positive electrode side power line and one end of the detection capacitor;

a second switch and a second resistor connected in series with each other between the negative electrode side power line and an another end of the detection capacitor;

a third switch connecting the one end of the detection capacitor and the ground;

a fourth switch connecting the another end of the detection capacitor and the ground; and a discharge circuit having one end and an another end, the one end of the discharge circuit being connected to the positive electrode side power line and the another end of the discharge circuit being connected to the negative electrode side power line, wherein the discharge circuit includes:

a discharge capacitor, a fifth switch that is provided at the one end of the discharge circuit and connects one end of the discharge capacitor and the positive electrode side power line;

a sixth switch that is provided at the another end of the discharge circuit and connects an another end of the discharge capacitor and the negative electrode side power line;

a first discharge resistor and a seventh switch connected in series between the one end of the discharge capacitor and the ground; and a second discharge resistor and an eighth switch connected in series between the another end of the discharge capacitor and the ground, wherein a connection point of the fifth switch and the positive electrode side power line is positioned closer to the positive electrode side Y capacitor along the positive electrode side power line than the first resistor, and wherein a connection point of the sixth switch and the negative electrode side power line is positioned closer to the negative electrode side Y capacitor along the negative electrode side power line than the second resistor.

2. The ground fault detection device according to claim 1, wherein
an electrical resistance value of the second discharge resistor is smaller than an electrical resistance value of the first resistor.

3. The ground fault detection device according to claim 1, wherein
an electrical resistance value of the first discharge resistor is smaller than an electrical resistance value of the second resistor.

4. The ground fault detection device according to claim 1, wherein
the discharge circuit further includes a first circuit and a second circuit that connect the second discharge resistor and the eighth switch to the ground,
the first circuit and the second circuit are connected in parallel,
the first circuit includes a third discharge resistor, and
the second circuit includes a ninth switch.

5. The ground fault detection device according to claim 1, wherein
the discharge circuit further includes a first circuit and a second circuit that connect the first discharge resistor and the seventh switch to the ground,
the first circuit and the second circuit are connected in parallel,
the first circuit includes a third discharge resistor, and
the second circuit includes a ninth switch.

6. A ground fault detection device connected to a system provided with a high-voltage battery and configured to detect a decrease in insulation resistance of the system, the system comprising: the high-voltage battery; a positive electrode side power line to which a positive electrode terminal of the high-voltage battery is connected; a negative electrode side power line to which a negative electrode terminal of the high-voltage battery is connected; a positive electrode side termination resistor and a positive electrode side Y capacitor connected in parallel with each other between the positive electrode side power line and a ground; and a negative electrode side termination resistor and a negative electrode side Y capacitor connected in parallel with each other between the negative electrode side power line and the ground, and the ground fault detection device comprising:
a detection capacitor operating as a flying capacitor;
a control unit measuring a voltage of the detection capacitor;
a first switch and a first resistor connected in series with each other between the positive electrode side power line and one end of the detection capacitor;
a second switch and a second resistor connected in series between the negative electrode side power line and an another end of the detection capacitor;
a third switch connecting the one end of the detection capacitor and the ground;
a fourth switch connecting the another end of the detection capacitor and the ground; and
a discharge circuit having one end and an another end, the one end of the discharge circuit being connected to the positive electrode side power line, and the another end of the discharge circuit being connected to the negative electrode side power line,
wherein the discharge circuit includes:
a first discharge capacitor and a second discharge capacitor,
a fifth switch that is provided at the one end of the discharge circuit and connects one end of the first discharge capacitor to the positive electrode side power line;
a sixth switch that is provided at the another end of the discharge circuit and connects one end of the second discharge capacitor to the negative electrode side power line;
a seventh switch that connects the one end of the first discharge capacitor and the ground;
an eighth switch that connects the one end of the second discharge capacitor and the ground; and
a first circuit that connects an another end of the first discharge capacitor and another end of the second discharge capacitor to the ground,
wherein the first circuit includes a first discharge resistor;
wherein a connection point of the fifth switch and the positive electrode side power line is positioned closer to the positive electrode side Y capacitor along the positive electrode side power line than the first resistor, and
wherein a connection point of the sixth switch and the negative electrode side power line is positioned closer to the negative electrode side Y capacitor along the negative electrode side power line than the second resistor.

7. The ground fault detection device according to claim 6, wherein
an electrical resistance value of the first discharge resistor is smaller than an electrical resistance value of the first resistor.

8. The ground fault detection device according to claim 6, wherein
the discharge circuit further includes a second circuit that connects the another end of the first discharge capacitor and the another end of the second discharge capacitor to the ground and is connected in parallel with the first circuit, and
the second circuit includes a second discharge resistor having an electrical resistance value different from an electrical resistance value of the first discharge resistor and a ninth switch.

9. The ground fault detection device according to claim 8, wherein
an electrical resistance value of the second discharge resistor is smaller than the electrical resistance value of the first discharge resistor.

* * * * *